(12) United States Patent
O'Lionaird et al.

(10) Patent No.: US 11,175,787 B2
(45) Date of Patent: *Nov. 16, 2021

(54) CAPACITANCE SENSING AND INDUCTANCE SENSING IN DIFFERENT MODES

(71) Applicant: Cypress Semiconductor Corporation, San Jose, CA (US)

(72) Inventors: Cathal O'Lionaird, Macroom (IE); Markus Unseld, Elchingen (DE); Paul Walsh, Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/825,805

(22) Filed: Mar. 20, 2020

(65) Prior Publication Data
US 2020/0319733 A1 Oct. 8, 2020

Related U.S. Application Data

(63) Continuation of application No. 15/637,090, filed on Jun. 29, 2017, now Pat. No. 10,635,246.
(Continued)

(51) Int. Cl.
*G06F 3/046* (2006.01)
*G06F 3/041* (2006.01)
(Continued)

(52) U.S. Cl.
CPC ............ *G06F 3/046* (2013.01); *G06F 1/1692* (2013.01); *G06F 3/0445* (2019.05);
(Continued)

(58) Field of Classification Search
CPC .......... G06F 3/041; G06F 3/044; G06F 3/046; G06F 3/04166; G06F 2203/04106
See application file for complete search history.

(56) References Cited

U.S. PATENT DOCUMENTS

| 4,950,987 A | 8/1990 | Vranish et al. |
| 5,220,324 A | 6/1993 | Morita |

(Continued)

FOREIGN PATENT DOCUMENTS

| EP | 751403 A1 | 1/1997 |
| JP | 2012168747 A | 9/2012 |

(Continued)

OTHER PUBLICATIONS

USPTO Non-Final Rejection for U.S. Appl. No. 16/391,069 dated Jul. 15, 2020; 21 pages.
(Continued)

*Primary Examiner* — Kent W Chang
*Assistant Examiner* — Chayce R Bibbee

(57) ABSTRACT

An apparatus for inductive sensing or capacitive sensing is described. The apparatus may include a signal generator to output on a first terminal a first signal in a first mode and a second signal in a second mode. The apparatus may include a charge measuring circuit to receive on a second terminal a third signal in the first mode and a fourth signal in the second mode. The third signal is representative of an inductance of a sense unit coupled between the first terminal and the second terminal. The fourth signal is representative of a capacitance of the sense unit.

20 Claims, 24 Drawing Sheets

Related U.S. Application Data

(60) Provisional application No. 62/470,061, filed on Mar. 10, 2017, provisional application No. 62/470,044, filed on Mar. 10, 2017.

(51) Int. Cl.
  *G06F 3/044* (2006.01)
  *G06F 1/16* (2006.01)
  *H03K 17/96* (2006.01)

(52) U.S. Cl.
  CPC ........ *G06F 3/0448* (2019.05); *G06F 3/04164* (2019.05); *G06F 3/04166* (2019.05); *H03K 17/9622* (2013.01); *G06F 2203/04103* (2013.01); *G06F 2203/04104* (2013.01); *G06F 2203/04106* (2013.01); *H03K 2017/9602* (2013.01); *H03K 2017/9613* (2013.01); *H03K 2217/9607* (2013.01); *H03K 2217/96073* (2013.01)

(56) References Cited

U.S. PATENT DOCUMENTS

| | | |
|---|---|---|
| 8,711,120 B2 | 4/2014 | Hargreaves et al. |
| 8,773,366 B2 | 7/2014 | Hable et al. |
| 9,077,343 B2 | 7/2015 | Gong et al. |
| 9,354,698 B2 | 5/2016 | Alameh et al. |
| 9,377,905 B1 | 6/2016 | Grivna et al. |
| 9,569,053 B2 | 2/2017 | Elias et al. |
| 10,635,246 B2 * | 4/2020 | O'Lionaird ........... G06F 3/0445 |
| 2003/0076093 A1 | 4/2003 | Lourens et al. |
| 2003/0076096 A1 | 4/2003 | Lourens et al. |
| 2005/0280530 A1 | 12/2005 | Lizza |
| 2006/0066585 A1 | 3/2006 | Lin |
| 2008/0150905 A1 | 6/2008 | Grivna et al. |
| 2009/0009483 A1 | 1/2009 | Hotelling et al. |
| 2010/0225332 A1 | 9/2010 | Niwa et al. |
| 2010/0238121 A1 | 9/2010 | Ely |
| 2010/0328249 A1 | 12/2010 | Ningrat et al. |
| 2012/0050213 A1 | 3/2012 | Bokma |
| 2012/0262222 A1 | 10/2012 | Schwartz et al. |
| 2012/0268415 A1 | 10/2012 | Konovalov et al. |
| 2013/0018489 A1 | 1/2013 | Grunthaner et al. |
| 2013/0106769 A1 | 5/2013 | Bakken et al. |
| 2013/0321331 A1 | 12/2013 | Chang |
| 2014/0043293 A1 | 2/2014 | Hotelling et al. |
| 2014/0078096 A1 | 3/2014 | Tan et al. |
| 2014/0152621 A1 | 6/2014 | Okayama et al. |
| 2015/0002425 A1 | 1/2015 | Lee et al. |
| 2015/0002453 A1 | 1/2015 | Lu et al. |
| 2015/0022224 A1 | 1/2015 | Ruusunen et al. |
| 2015/0338968 A1 | 11/2015 | Yao et al. |
| 2016/0011235 A1 | 1/2016 | Condorelli et al. |
| 2016/0048256 A1 | 2/2016 | Day |
| 2016/0139287 A1 | 5/2016 | Mangano et al. |
| 2016/0188105 A1 | 6/2016 | Kremin et al. |
| 2016/0224185 A1 | 8/2016 | Hotelling et al. |
| 2017/0024056 A1 | 1/2017 | Wilkinson et al. |
| 2017/0371473 A1 | 12/2017 | David et al. |

FOREIGN PATENT DOCUMENTS

| | | |
|---|---|---|
| JP | 2015028712 A | 2/2015 |
| JP | 2015041318 A | 3/2015 |
| JP | 2017504800 A | 2/2017 |
| WO | 2012057887 A1 | 5/2012 |

OTHER PUBLICATIONS

JPO Office Action for Application No. 2019-548889 dated Jan. 5, 2021; 3 pages.
USPTO Non-Final Rejection for U.S. Appl. No. 16/391,069 dated Feb. 8, 2021; 12 pages.
"TI To The Rescue With Capacitive And Inductive Sensing" arrow.com [online], published on Sep. 4, 2016, retrieved from internet.
International Search Report for International Application No. PCT/US18/18909 dated Mar. 16, 2018; 4 pages.
International Search Report for International Application No. PCT/US18/19252 dated Mar. 26, 2018; 4 pages.
Lo, Pei-Hsuan, "Implementation of Vertical-Integrated Dual Mode Inductive-Capacitive Proximity Sensor," IEEE Journal, Jan. 29, 2012, pp. 640-643; 4 pages.
Marneweck, Kobus, "Azoteq Announces Sensitivity Breakthrough In Capacitive Proximity Sensing," prweb.com [online], published on Jan. 27, 2012 [retrieved on Apr. 6, 2017] retrieved from internet.
USPTO Advisory Action for U.S. Appl. No. 15/637,090 dated Jun. 12, 2019; 3 pages.
USPTO Advisory Action for U.S. Appl. No. 15/637,090 dated Jul. 26, 2018; 4 pages.
USPTO Advisory Action for U.S. Appl. No. 15/637,731 dated Jun. 15, 2018; 3 pages.
USPTO Applicant Initiated Interview Summary for U.S. Appl. No. 15/637,090 dated May 10, 2018; 2 pages.
USPTO Applicant Initiated Interview Summary for U.S. Appl. No. 15/637,090 dated Dec. 19, 2019; 2 pages.
USPTO Applicant Initiated Interview Summary for U.S. Appl. No. 15/637,731 dated Nov. 16, 2017; 3 pages.
USPTO Applicant-Initiated Interview Summary for U.S. Appl. No. 15/637,090 dated Aug. 9, 2019, 2 pages.
USPTO Final Rejection for U.S. Appl. No. 15/637,090 dated Mar. 21, 2019; 19 pages.
USPTO Final Rejection for U.S. Appl. No. 15/637,090 dated May 10, 2018; 32 pages.
USPTO Final Rejection for U.S. Appl. No. 15/637,731 dated Mar. 8, 2018; 30 pages.
USPTO Non-Final Rejection for U.S. Appl. No. 15/637,090 dated Aug. 9, 2019, 20 pages.
USPTO Non-Final Rejection for U.S. Appl. No. 15/637,090 dated Oct. 5, 2018; 27 pages.
USPTO Non-Final Rejection for U.S. Appl. No. 15/637,090 dated Nov. 13, 2017; 28 pages.
USPTO Non-Final Rejection for U.S. Appl. No. 15/637,731 dated Jul. 26, 2018; 32 pages.
USPTO Non-Final Rejection for U.S. Appl. No. 15/637,731 dated Sep. 8, 2017; 32 pages.
USPTO Notice of Allowance for U.S. Appl. No. 15/637,090 dated Dec. 19, 2019; 8 pages.
USPTO Notice of Allowance for U.S. Appl. No. 15/637,731 dated Feb. 8, 2019; 19 pages.
Written Opinion for the International Searching Authority for International Application No. PCT/US18/18909 dated Mar. 16, 2018; 7 pages.
Written Opinion of the International Searching Authority for International Application No. PCT/US18/19252 dated Mar. 26, 2018; 10 pages.
USPTO Notice of Allowance for U.S. Appl. No. 16/391,069 dated Jul. 13, 2021; 9 pages.

* cited by examiner

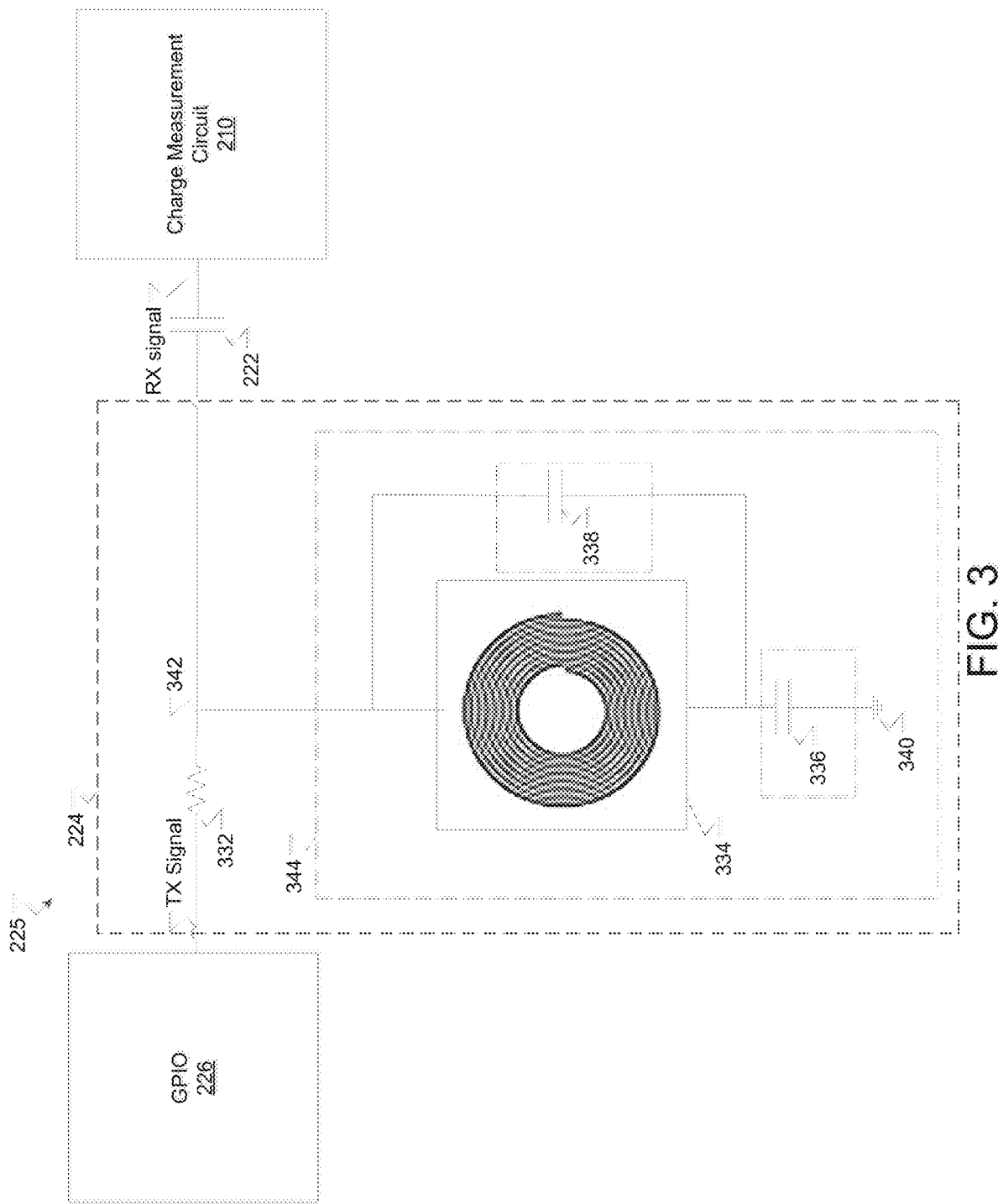

CAPACITANCE SENSING AND INDUCTANCE SENSING IN DIFFERENT MODES

RELATED APPLICATIONS

The present application is a continuation application of U.S. Non-Provisional application Ser. No. 15/637,090, filed on Jun. 29, 2017, which claims the priority and benefit of U.S. Provisional Application No. 62/470,061, filed on Mar. 10, 2017, and U.S. Provisional Application No. 62/470,044, filed on Mar. 10, 2017, all of which are incorporated by reference herein in their entirety.

BACKGROUND

A touch sensor may be used to detect the presence and location of an object or the proximity of an object within a touch-sensitive area of the touch sensor. For example, touch sensing circuitry may detect the presence and location of a touch object proximate to a touch sensor disposed in connection with a display screen. There are a number of different types of touch sensors. The types of touch sensor may include resistive touch sensors, surface acoustic wave touch sensors, capacitive touch sensors, inductive touch sensing, and so forth. The different touch sensors may detect different types of objects.

BRIEF DESCRIPTION OF THE DRAWINGS

The present disclosure is illustrated by way of example, and not of limitation, in the figures of the accompanying drawings in which:

FIG. 3 illustrates a sense unit where the resonant circuit includes a resistor, an inductor, a capacitor, a second capacitor, and a ground, according to an embodiment.

DETAILED DESCRIPTION

Figure 1:
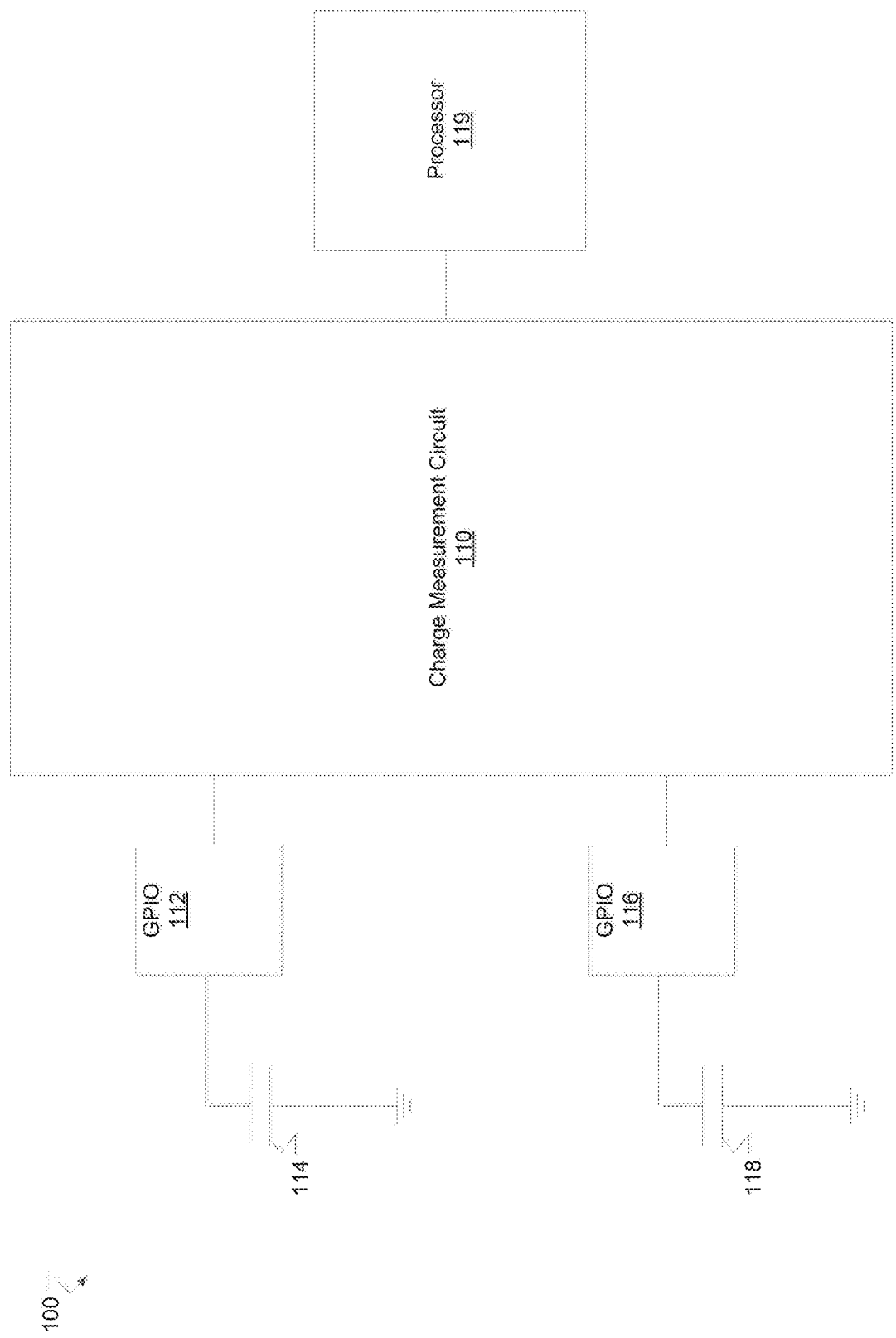
FIG. 1 illustrates sensing circuit for self-capacitance sensing according to an embodiment.

Many electronic devices include touch sensors (also referred to herein as sense units or unit cells) for the user to interact with the electronic devices. For example, automatic teller machines (ATMs), information kiosks, smartphones, vending machines, washing machines, televisions, computers, and refrigerators may include sense units and corresponding touch sensing circuitry. When an object touches or is proximate to the sense unit, the touch sensing circuitry may be used to capture and record the presence and location of the objects using the sense unit.

Unlike buttons or other mechanical controls, sense units may be more sensitive and may respond differently to different types of touch, such as tapping, swiping and pinching. The different sense units may also respond differently to different types of objects. There are various techniques for measuring capacitance, inductance, or resistance, but these different techniques use different types of sense units and different circuits to measure capacitance, inductance, or resistance. For example, the inductive sensing may be used to detect ferrous and non-ferrous metals and the capacitive sensing may be used to detect ferrous and non-ferrous conductive objects. Conventionally, to detect the different types of objects, a device would have to include different sense elements and different circuits to measure these different types of objects. Integration of these different sense elements and circuitry may not be feasible in terms of cost or available space within the device, especially when the device form factor is small.

Embodiments of the present disclosure describe technology for combined inductive and capacitive sensing. The embodiments may provide a sense unit that may be used to detect different types of objects and combined inductive and capacitive sensing circuitry that may be used to detect these different types of object using inductive sensing and capacitive sensing. In one embodiment, the sense unit may be used for capacitive sensing in a first mode and the same sensing unit can be used for inductive sensing in a second mode. In one embodiment, the combined inductive and capacitive sensing circuitry (also referred to herein as "touch sensing circuitry" or "sensing circuitry") using a type of capacitive sensing circuitry in a way that it can measure inductance of the sense element in a first mode (inductive sensing mode) and capacitive of the sense element in a second mode (capacitive sensing mode), as described in more detail herein. When the sensing circuit operates in the capacitive sensing mode, the sensing circuit may use the sense unit to detect objects using a capacitive sensing technique. When the sensing circuit operates in the inductive sensing mode, the sensing circuit may detect ferrous and non-ferrous metal objects proximate to the sense unit using inductive sensing techniques.

In one embodiment, the sensing circuitry includes 1) a signal generator to output on a first terminal a first signal in a first mode and a second signal in a second mode; and 2) a charge measuring circuit to receive on a second terminal a third signal in the first mode and a fourth signal in the second mode. The third signal is representative of an inductance of a sense unit coupled between the first terminal and the second terminal and the fourth signal is representative of a capacitance of the sense unit.

In another embodiment, a sense unit includes a first terminal coupled to a first node, a first electrode coupled to the first node, a second terminal, and a second electrode coupled to the second terminal. The sense unit also includes an inductive coil and a first capacitor. In a first mode (capacitive sensing mode), a first signal is received at the first terminal and a second signal is output on the second terminal. The second signal is representative of a capacitance of the sense unit. In a second mode (inductive sensing mode), a third signal is received at the first terminal and a fourth signal is output from the second terminal. The fourth signal is representative of an inductance of the sense unit.

FIG. 1 illustrates sensing circuit 100 for self-capacitance sensing according to an embodiment. The sensing circuit 100 may include a processor 119, a charge measurement circuit (CMC) 110, a general purpose input/output (GPIO) 112, a sense capacitor ($C_{sense}$) 114, a GPIO 116, and a modulator capacitor ($C_{mod}$) 118. The GPIO 112 and GPIO 116 may be any types of terminals that are configured to couple to external components, such as the sense units, as well as other external devices. In one example, GPIOs may be terminals that are points of connection to a circuit. The GPIOs that may couple to pins, pads, solder bumps, or the like. In another example, GPIOs may include special d outputs, dedicated outputs/Inputs® or the like. The GPIOs may be internal routing mechanism to connect pins or pad to power source, a ground, a high-Z, internal circuitry (such as sensing circuitry), a pulse width modulator (PWM), or the like.

In FIG. 1, GPIO 112 is coupled to a sense element 114, which is a single electrode. The CMC 110 can measure a self-capacitance of the single electrode with respect to a ground potential. As such, the sense element 114 ($C_{sense}$) is represented as an external capacitor. The CMC 110 may use a modulator capacitor ($C_{mod}$) 118 for measuring the capacitance on sense element 114. In some embodiments, the $C_{mod}$ 118 is an external capacitor coupled to GPIO 116, as illustrated in FIG. 1. In one example, the CMC 110 may be a capacitance-to-digital converter (CDC). In another example, the CMC 110 may be a charge transfer circuit, a capacitive sensing charge measurement circuit, a capacitive sensing sigma-delta (CSD) circuit, or the like. The CSD circuit may include physical, electrical, and software components.

The CSD circuit may have an array of capacitive sense elements (as the sense units) coupled to a sigma-delta modulator though an analog multiplexer, digital counting functions, and high-level software routines to compensate for environmental and physical sensor element variations. The physical component may include the physical sensor element itself, typically a pattern constructed on a printed circuit board (PCB) with an insulating cover, a flexible membrane, or a transparent overlay. In one embodiment, the physical component may also include a transparent conductor, such as indium tin oxide (ITO) disposed on a substrate, which may be transparent as well. The electrical component may convert a charged capacitance into a measured signal. The electrical component may include an operational amplifier that may output a bit stream that may be quantified by a counter circuit or a timer circuit. The software component may include detection and compensation software algorithms to convert a count value into a sensor element detection decision.

As illustrated in FIG. 1, the CMC 110 may be coupled to the GPIO 112 and the GPIO 116. In one example, the GPIO 112 may be a first terminal of the CMC 110 and the GPIO 116 may be a second terminal of the CMC 110. Terminals may be pins, pads, solder bumps, or other mechanisms to connect conductors of the different devices or components. During operation, the CMC 110 may use the sense element 114 ($C_{sense}$) to take a charge measurement. For example, the CMC 110 may charge and discharge the electrode of the sense unit in order to measure a capacitance of the sense element 114 ($C_{sense}$). The CMC 110 may digitize the measured capacitance into an accumulated voltage value or bit stream. In one embodiment, the CMC 110 may compare the charge measurement to a reference value to determine a difference between the charge measurement and the reference value. In one embodiment, the reference value may be a previous value measured by the charge measurement circuit 110. In another embodiment, the reference value may be a predefined value. The predefined value may be a default reference value or derived from previously measured charge measurement values taken over time. The difference value may indicate a difference between the charge measurement and reference value. In one example, the CMC 110 may send the difference value to the processor 119. The processor 119 or the CMC 110 may determine whether the difference value exceeds a threshold value. When the difference value exceeds the threshold value, the difference value indicates that an object is proximate to the sense element 114 ($C_{sense}$).

When the difference value does not exceed the threshold value, the difference value indicates that no object that may be detected using capacitive sensing is proximate to the $C_{sense}$ 114.

Figure 2A:
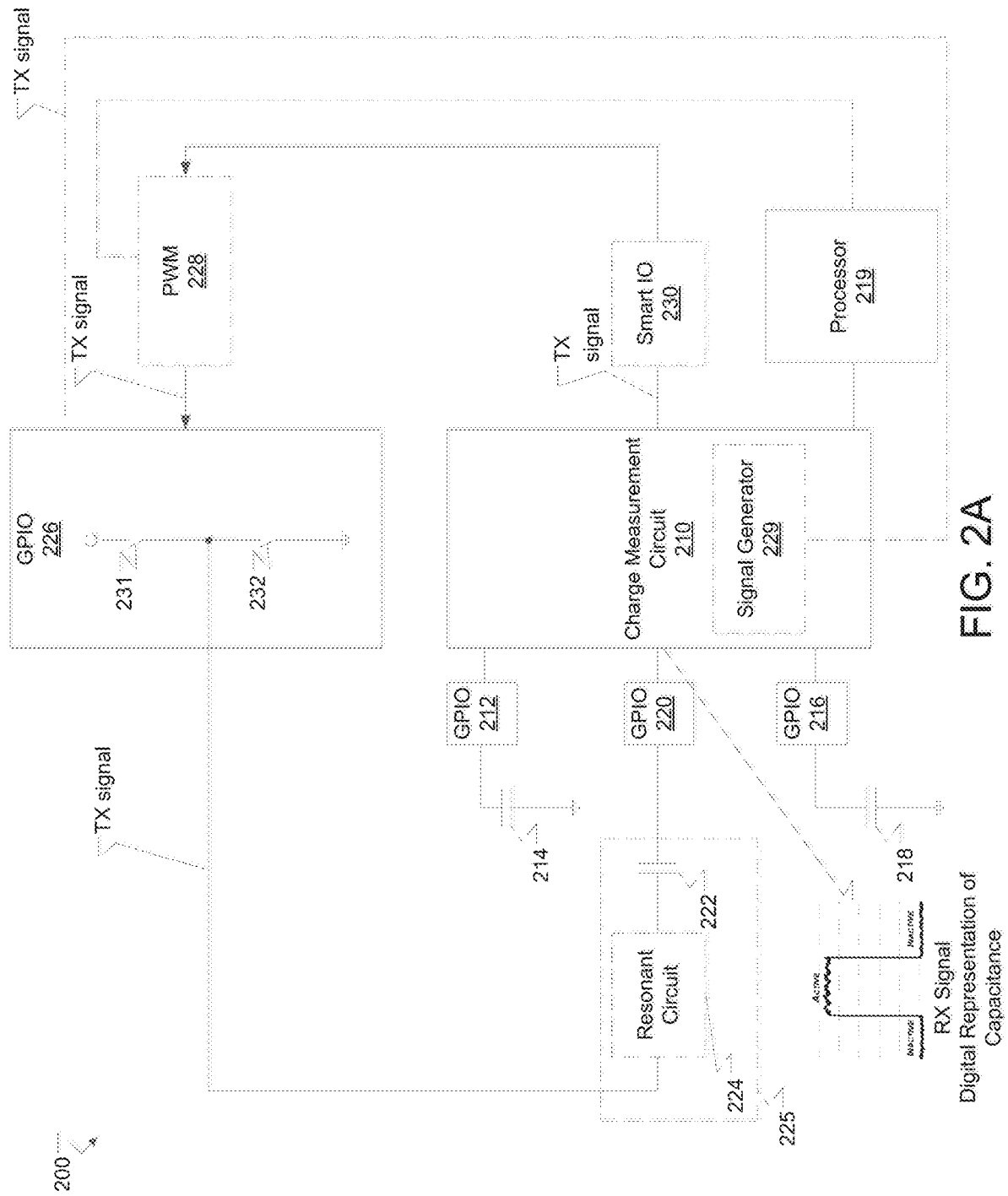
FIG. 2A illustrates device for capacitive sensing and inductive sensing, according to an embodiment.

FIG. 2A illustrates device 200 for capacitive sensing and inductive sensing, according to an embodiment. The device 200 can measure a capacitance of a sense unit 225, an inductance of the sense unit 225, or both, as described herein. The device 200 includes a charge measurement circuit 210 that is coupled to the sense unit 225. In a capacitive sensing mode, the charge measurement circuit 210 may include a signal generator 229 that can generate an excitation (TX) signal that can be applied via GPIO 226 to the sense unit 225 and a receiver channel (not illustrated in FIG. 2A) that can measure a receive (RX) signal at GPIO 220. The RX signal is representative of a mutual capacitance of the sense unit 225. In another embodiment, the charge measurement circuit 210 can charge and discharge the sense unit 225 via GPIO 220 to measure a self-capacitance.

In the inductive sensing mode, the charge measurement circuit 210 may phase shift the TX signal relative to a reference signal to generate a phase-shifted signal to be applied to the sense unit 225. For example, the charge measurement circuit 210 can output the TX signal to a smart input/output interface 230 (herein after "smart IO 230") and a pulse width modulator (PWM) 228 to generate a phase-shifted TX signal (e.g., TX signal shifted by 90 degrees) as described herein. In another example, the smart IO 230 and/or the PWM 228 may shift a phase of a signal. A second receive (RX) signal can be measured by the charge measurement circuit 210 via GPIO 220. The second RX signal is representative of an inductance of the sense unit 225.

The charge measurement circuit 210 can use a modulator capacitor ($C_{mod}$) 214 and another capacitor (Crook) 218 in capacitive sensing mode, inductive sensing mode, or both, as described herein. The charge measurement circuit 210 may also include an analog-to-digital converter (ADC) to convert the analog measurements of the capacitance and inductance of the sense unit 225 into digital values. These digital values can be output to a processor 219 for further digital signal processing for an application.

As illustrated in FIG. 2A, the sense unit 225 may have a resonant circuit 224 and a pair of electrodes (a first electrode and a second electrode) that form a sense capacitor 222. Various embodiments of the sense unit 225, including the resonant circuit 224 are described and illustrated with respect to FIGS. 2B-6D. In the capacitive sensing mode, the CMC 210 may measure a mutual capacitance of the sense unit 225, where the mutual capacitance is between the first electrode and the second electrode of sense capacitor 222. In the inductive sensing mode, the CMC 210 may measure an inductance for inductive sensing, as described herein. For example, the CMC 210 may measure an inductance of a sense unit 225. The number of sense units 225 that the device 200 includes is not intended to be limiting. For example, the device 200 may include a single sense unit 225 or multiple sense units 225.

In one embodiment, the processor 219, the CMC 210, the $C_{mod}$ 214, the $C_{Tank}$ 218, the PWM 228, and/or the smart IO 230 of the device 200 may be located on the same integrated circuit having the GPIO 226, 212, 220, 216 that are coupled to the sense unit 225, the modulator capacitor ($C_{mod}$) 214, and the tank capacitor ($C_{tank}$) 218. Alternatively, the different components of the device 200 may be implemented in multiple integrated circuits. The modulator capacitor ($C_{mod}$) 214 and the tank capacitor ($C_{tank}$) 218 may be located, at least in part, external to the integrated circuit containing the charge measurement circuit 210.

As noted above, the CMC 210 may include a signal generator 229. The signal generator 229 may generate a transmit (TX) signal (also referred to as an excitation signal). In one example, the TX signal may be a square wave signal. The smart IO 230 may be coupled to the CMC 210. The smart IO 230 may be a digital controller of an IO interface that is external to a microcontroller (MCU) or not coupled to the MCU. The smart IO 230 may offload tasks from the MCU to provide a configuration of IOs.

In one embodiment, the PWM 228 may be coupled to the smart IO 230. In another embodiment, the PWM 228 may be coupled directly to the CMC 210. The PWM 228 may adjust a phase of the TX signal. In one example, an input of the PMW 228 may be mixed with the TX signal to adjust a phase of the TX signal.

A phase of the TX signal may be shifted as the device 200 takes an inductive sensing measurement. Alternatively, there may be other embodiments where the TX signal is shifted for capacitive sensing measurement. In one example, the signal generator 229 may generate a TX signal with a phase of 0 degrees relative to a reference signal. When the phase of the TX signal is 0 degrees, the CMC 210 may operate in a capacitance sensing mode to taking a capacitive sensing measurement, as discussed below. When the CMC 210 operates in an inductance sensing mode to take an inductive sensing measurement, the phase of the TX signal may be shifted 90 degrees, as discussed below.

The GPIO 226 may include a driver to adjust an amplitude of the TX signal. For example, the GPIO 226 may include a first switch 231 and a second switch 232. A switch may be a transistor, a gate, a device for making or breaking the connection in a circuit, and so forth. In one example, when the GPIO 226 is coupled to a power source through a closed first switch 231 and an open second switch 232, the GPIO 226 may be set as high. In another example, when the GPIO 226 is coupled to ground through a closed second switch 232 and an open first switch 231, the GPIO 226 may be set as low. In another example, when the GPIO 226 is shorted to power and ground, the first switch 231 and the second switch 232 are closed. In another example, when the switches 231 and 232 are both open, the GPIO 226 may be set to a high impedance (high-Z) and may output the signal received from the PMW 228. In one example, the processor 119 or the smart IO 230 may control the switches 231 and 232 via the PWM 228.

In one embodiment, the GPIO 226 may be coupled to the sense capacitor 222 (first and second electrodes). The charge measurement circuit 210 can apply a TX signal on GPIO 226, which is coupled to the sense unit 225. The TX signal may excite the sense capacitor 222. Exciting a circuit or component may refer to applying a voltage or current to the circuit or component. For example, by applying a voltage of the TX signal on a first electrode of the sense capacitor 222, a RX signal is inducted on a second electrode of the sense capacitor 222. The voltage or current of the RX signal may be measured by the charge measurement circuit 210 via GPIO 220. As noted above, the RX signal may be integrated by an analog to digital converter (ADC) as part of the digitization of the RX signal. The processor 219 can further process the digital signals as described herein.

To take a mutual capacitance measurement, the CMC 210 may measure a mutual capacitance between a first electrode and a second electrode, where the mutual capacitance between the first electrode and the second electrode may be represented as sense capacitor 222. The device 200 may also include two capacitors for integration. In one embodiment, $C_{mod}$ 214 may be used for mutual capacitance sensing. The current from $C_{mod}$ 214 may be integrated onto $C_{tank}$ 218 and the TX signal is demodulated. In one example, $C_{Mod}$ 214 may be used for self capacitance sensing and the current may be integrated onto $C_{tank}$ 218. For mutual capacitance sensing, the $C_{Mod}$ 214 and the $C_{tank}$ 218 may be used for capacitance sensing.

In another embodiment, the device 200 may include the resonant circuit 224 coupled between the GPIO 226 and the sense capacitor 222. The resonant circuit 224 and the sense capacitor 222 may form a sense unit 225. The CMC 210 may apply the TX signal via GPIO 226 to the resonant circuit 224 to excite the resonant circuit 224. FIGS. 3-6D illustrates different embodiments of the resonant circuit 224, as discussed below.

The GPIO 220 may couple the TX signal sent from the GPIO 226 via the resonant circuit 224 and/or the capacitor 222 to the CMC 210. The signal received at the GPIO 220 may be referred to as a received (RX) signal. The CMC 210 may compare an amplitude of the RX signal to a reference signal. For example, a converter of the CMC 210 may use the $C_{Mod}$ 214 as an integration capacitor. A charge may be added or removed from the capacitor. For example, a current may be induced by voltage swings on the capacitor from an electrode. The charge of the integration capacitor may be digitized at a converter of the CMC 210 to a first count. The charge measured at the capacitor 222 is also digitized by the converter into a second count. The digitization of the measured charges to counts functions as a capacitance to digital converter.

The first count is compared to the second count to determine a relative difference between the digital representations of the capacitance from the capacitors 214 and 218 and the capacitor 222. When a relative difference between the first count and the second count exceeds a threshold, the difference in counts indicates a change in the capacitance of the capacitor 222. The change in capacitance may indicate a presence of an object proximate to the capacitor 222. In one example, the difference in counts may be represented as the difference in amplitudes of the signals from the GPIO 220 and an integrated signal from the GPIOs 212 and 216.

In one example, when a relative difference between the counts does not exceed a threshold amount, the relative difference may indicate an object is not proximate to the device 200. In another example, when relative difference between the counts does not exceed a threshold amount, the device 200 may not be configured to sense the type of object proximate to the device 200. In one example, when the device 200 is configured to perform capacitive sensing, the device 200 may not be able to sense ferrous or non-ferrous metal objects. In another example, when the device 200 is configured to perform inductive sensing, the device 200 may not be able to sense capacitive objects. In one embodiment, to perform the capacitive sensing, a phase of the TX signal may be 0 degrees. In another embodiment, to perform the inductive sensing, a phase of the TX signal may be shifted. When the phase of the TX signal is shifted, the shift in phase changes how charge gets coupled to the resonant circuit 224 and the capacitor 222. In one example, the resonant circuit 224 may not resonate when being used for capacitive sensing. When the resonant circuit 224 does not resonate, the inductor may not be excited in the resonant circuit 224. In another example, the resonant circuit 224, such as the inductor, may resonate when being used to for inductive sensing. The TX signal may be phase shifted provide that the corresponding RX signal may be demodulated at the CMC 210. In one example, the phase of the TX signal may be shifted by approximately 80 to 100 degrees. In another example, the phase of the TX signal may be shifted by at least 45 degrees. In another example, the phase of the TX signal may be shifted by approximately 90 degrees. As the phase shift departs farther from the 90-degree phase shift, a change in the amplitude of the RX signal at the GPIO 220 may be reduced. As the amount of charge is reduced by the departure from the 90-degree phase shift, the accuracy of the inductive sensing may be reduced.

The processor 219 may be coupled to the PWM 228. The processor 119 may set the PWM 228 to set the phase of the TX signal generated by the CMC 210 to a first phase for conductive sensing or a second phase for inductive sensing. The processor 119 may also set the CMC 210 to measure for capacitive sensing or inductive sensing based on the phase of the TX signal. In one example, the CMC 210 may measure current in the form of charge for the TX signal at the GPIO 220. The CMC may measure a charge over time in the current. When the CMC 210 is set to measure the current or voltage for capacitive sensing, the CMC 210 may determine a first change in the charge for a signal with a 0-degree phase shift indicates a presence of an object. When the CMC 210 is set to a measure the current for inductive sensing, the CMC 210 may determine a second change in the charge for a signal with a 90-degree phase shift indicates a presence of an object proximate the capacitor 222. In one embodiment, the CMC 210, the smart IO 230, the processor 119, the PWM 228, the GPIO 226, the resonant circuit 224, the capacitor 222, the GPIO 533, the GPIO 216, the GPIO 220, the $C_{Mod}$ 214, and the $C_{Tank}$ 218 may be location on a single substrate, such as a single integrated circuit substrate or a common carrier substrate.

The CMC 210 may include a filter to filter the signal received at the GPIO 220. In one example, the filter may be an infinite impulse response (IIR) filter. In another example, the filter may be a decimator. In one example, the device 200 may be configured for capacitive sensing to receive input from a user and may be configured for inductive sensing to receive non-user inputs. For example, the device 200 may be configured for capacitive sensing when receiving user inputs via a touch screen and may be configured for inductive sensing when receiving inputs from a metal button, an angular position sensor for control knobs, door open sensor, a drawer open/close sensor, a liquid level sensor, and so forth.

In one embodiment, for the automotive environment, inductive sensing may be used to determine gear shifter positions and a capacitive sensor may be used for touch panel force detection. The device 200 may be integrated into a desktop computer, a laptop computer, a tablet computer, a personal digital assistant (PDA), a smartphone, a satellite navigation device, a portable media player, a portable game console, a kiosk computer, a point-of-sale device, a dishwasher, a washing machine, a liquid dispenser, a control panel on a household or other appliance that includes a sense unit, and so forth.

Figure 2B:
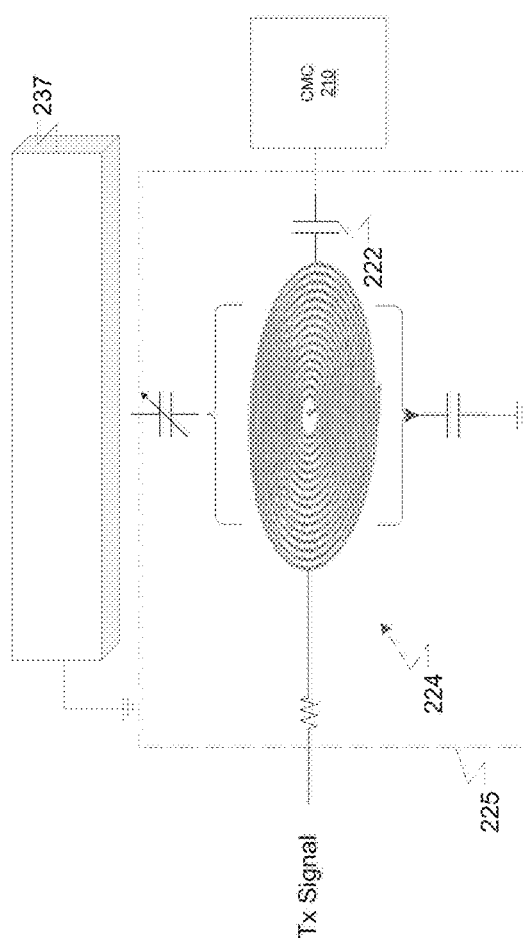
FIG. 2B illustrates the sensing unit that operates as a variable capacitor in a capacitance mode when a frequency of the TX signal is below or above a resonant frequency, according to one embodiment.

FIG. 2B illustrates the sensing unit 225 that operates as a variable capacitor in a capacitance mode when a frequency of the TX signal is below or above a resonant frequency, according to one embodiment. When the frequency of the TX signal received at the resonant circuit 224 differs from a resonant frequency of the resonant circuit 224 (such as below or above the resonance frequency), the resonant circuit 224 and the sense capacitor 222 may output a current for capacitance sensing. For example, the TX signal excites a current of a coil of the resonant circuit 224. The coil may interact with an induced current at the object. The proximity of the object 237 may affect an inductance of the coil. When the object 237 is grounded, a capacitance between the coil and the object may add to a total parasitic coupling of the coil to the ground and the capacitance is distributed. When a TX frequency is not at the resonant frequency, the resonant circuit may operate as a variable capacitor in a capacitance mode that may relay an RX signal to the CMC 210 for the CMC 210 to perform capacitance sensing.

Figure 2C:
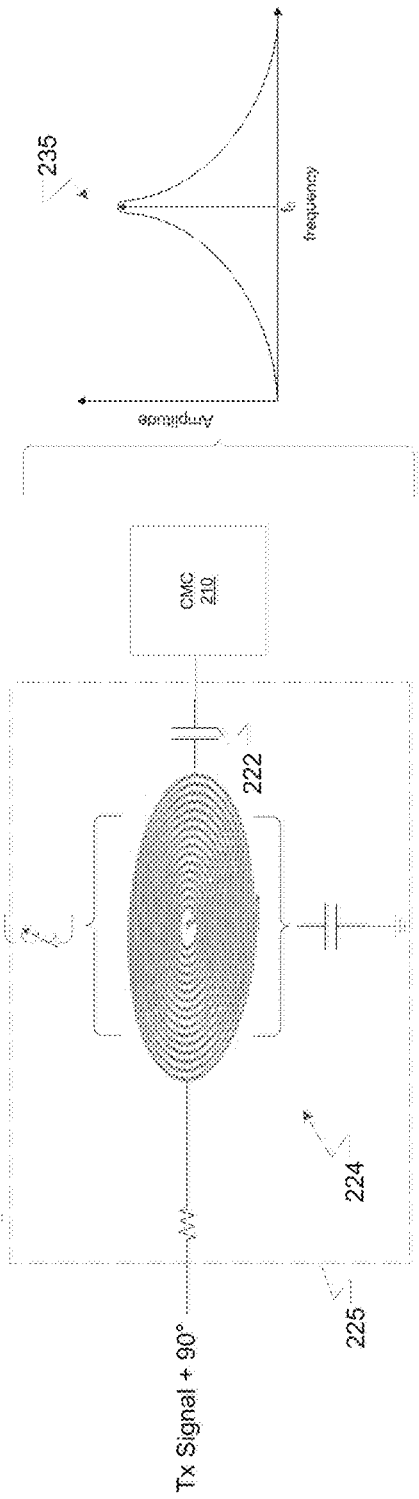
FIG. 2C illustrates the sensing unit that operates as a variable inductor in an inductance mode when the phase of the TX signal has been shifted to excite a resonant circuit, according to one embodiment.

FIG. 2C illustrates the sensing unit 225 that operates as a variable inductor in an inductance mode when the phase of the TX signal has been shifted to excite a resonant circuit, according to one embodiment. When the TX signal is at approximately a resonant frequency of the sensing unit 225 as shown in graph 235, the resonant circuit 224 and the capacitor 222 may operate as an inductive sense unit in an inductance mode. When the object 237 is grounded, the capacitance between the coil and the object 237 may add to the parasitic coupling of the coil to the ground and the capacitance is distributed. The electric current in the coil interacts with an induced current at the metal object. The proximity of the metallic object may affect the inductance of the coil. Additionally, when the frequency of the TX signal is at the resonant frequency, the current may be maximized so that the resonant circuit is relatively sensitive to a change in inductance as compared to a change in capacitance when operating in inductance mode.

Figure 2D:
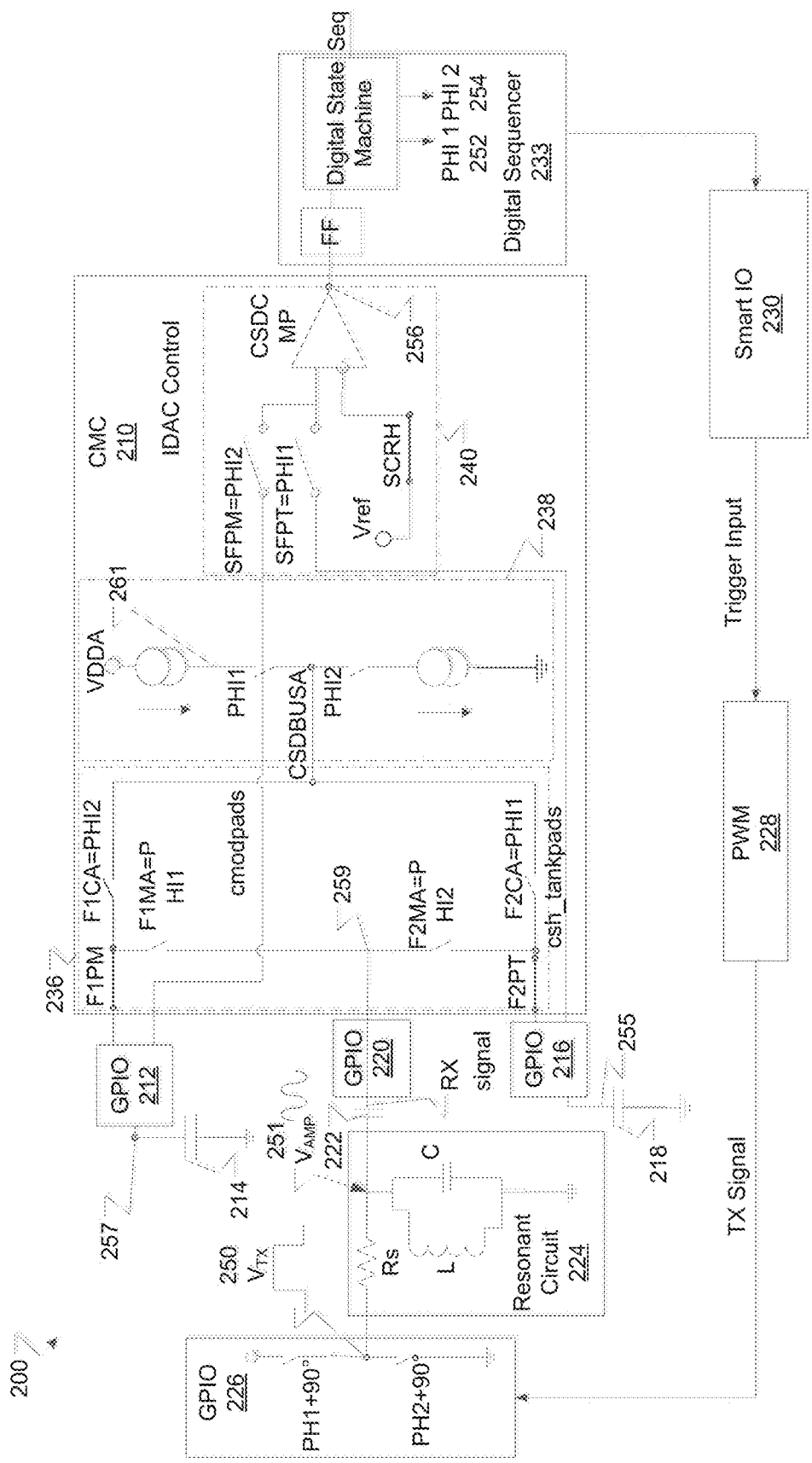
FIG. 2D illustrates a circuit level diagram of the device performing full-wave capacitive sensing and inductive sensing, according to an embodiment.

FIG. 2D illustrates a circuit level diagram of the device 200 performing full-wave capacitive sensing and inductive sensing, according to an embodiment. Some of the features in FIG. 2D are the same or similar to some of the features in FIGS. 1 and 2A as noted by the same reference numbers, unless expressly described otherwise. The device 200 may perform full-wave sensing using the GPIOs 212, 216, 220, and 226, the resonant circuit 224, a CMC 216, a digital sequencer 233, a smart IO 230, and/or a PWM 228.

The CMC 210 may generate a TX signal (also referred to as a csd_sense signal). The device 200 may operate in a capacitive sensing mode or an inductive sensing mode. The digital sequencer 233 may control the switches in the CMC 210 to configure the CMC 210 for capacitive sensing or inductive sensing. When the device 200 is operating in a capacitive sensing mode, the PWM 228 may not shift a phase of the TX signal that is sent to the sensing unit 225 via the GPIO 226. When the device 200 is operating in an inductive sensing mode, the PWM 228 may phase shift the TX signal before the TX signal is sent to the GPIO 226.

The GPIO 226 may be a driver that amplifies the TX signal or the phase-shifted TX signal when amplitudes of those signals is below a threshold amplitude level. The CMC 210 may send the TX signal via the GPIO 226 to the resonant circuit 224 at the node 251. The resonant circuit 224 may be a sensor, such as an RLC circuit or an electrode, that the CMC 210 may use to take a capacitance measurement or an inductance measurement, as discussed above. The GPIO 220 may receive the RX signal from the capacitor 222 and couple the RX signal to the CMC 210.

The CMC 210 may include an analog multiplexer (AMUX) 236, a balancer 238, and a comparator 240. The AMUX 236 may combine or aggregate the signals from the GPIO 212, the GPIO 216, and the GPIO 220 together and send the combined signal to the balancer 238. The balancer 238 may balance current sources of the CMC 210. For example, the balancer 238 may be coupled to the digital sequencer 233 by a control line. The balancer 238 may receive control signals from terminals PHI1 252 and PHI2 254 of the digital sequencer 233 to balance the CMC 210.

The balancer 238 may also include a timing network (not shown). The timing network may couple positive and negative charges at the CMC 210 with the correct phase. The balancer 238 may also include a demodulator that determines the counts of the CMC 210. The balancer 238 add charge to the resonant circuit 224, the $C_{Mod}$ 214, the $C_{Tank}$ 218, and the capacitor 222. In one example, the balancer 238 may add a charge back to the $C_{Mod}$ 214 and the $C_{Tank}$ 218 to return the charge of the the the $C_{Mod}$ 214 and the $C_{Tank}$ 218 to an initial charge level.

A converter may use the $C_{Mod}$ 214 as an integration capacitor to stores or integrates charge from multiple transfer operations. The charge is digitized at the converter to a digital value of the current (RX) which is representative of the capacitance. The comparator 240 may compare the digital value to a threshold to determine whether the amplitude of the RX signal has changed. The comparator 240 may compare a digital value representative of an amplitude of the RX signal from the GPIO 220 to a digital value representative of an amplitude of the reference signal at the comparator 240 to determine a relative difference between the amplitudes of the voltages for the RX signal and the reference signal. When the difference in the amplitudes exceeds a threshold amount, the difference may indicate a presence of an object proximate to the capacitor 222.

The CMC 210 may combine measurements while the device 200 is set for capacitive sensing and measurements are taken while the device 200 is set for inductive sensing. The CMC 210 may use the combined measurement information to distinguish between different types of objects. For example, the combined information can indicate whether an object is a plastic bottle or a metal can.

The digital sequencer 233 may control the switches in the CMC 210 to configure the CMC 210 for capacitive sensing or inductive sensing. The smart IO 230 may enable an internal interconnection of the digital sequencer 233 with the PWM 228 or a TX signal driver. The digital sequencer 233 may send a trigger input via the smart IO 230 to the PWM 228 to trigger the PWM 228 to shift a phase of the TX signal. In another embodiment, the smart IO 230 may be an external terminal connector that relays the signal between the digital sequencer and the PWM 228.

The PWM 228 may shift a phase of the TX signal to excite the components of the resonant circuit 224 for capacitive sensing or inductive sensing. In one embodiment, the PWM 228 may maintain a 0-degree phase to excite the resonant circuit 224 for capacitive sensing. In another embodiment, the PWM 228 may shift a phase of the TX signal by 90-degrees to excite the resonant circuit 224 for inductive sensing.

In one example, the resistor $R_s$ of the resonant circuit 224 may limit the current flow. In another example, the TX signal may be a sine wave and the resistor $R_s$ may set a peak-to-peak voltage of the sine wave. The capacitor 222 may couple the sine wave from the resonant circuit 224 into the CMC 210. In one example, the resistor $R_s$ may be a part of a GPIO and may be programmable. In another example, the GPIO could have different drive strength control to achieve the resistance.

In one example, to reduce a power consumption of the resonant circuit 224, a swing on the LC components of the resonant circuit 224 may not be maximized and a relatively large resistor Rs may be used. The GPIO 220 may receive the sine wave from the capacitor 222 and couple the RX signal to a sensing channel of the CMC 210. The CMC 210 may convert the RX signal into a digital value.

In one embodiment, the CMC 210 may include a full-wave capacitive sensing converter. The 90-degree phase shift by the PWM 228 may enable demodulation of the sine wave by the full-wave capacitive sense converter.

Figure 2E:
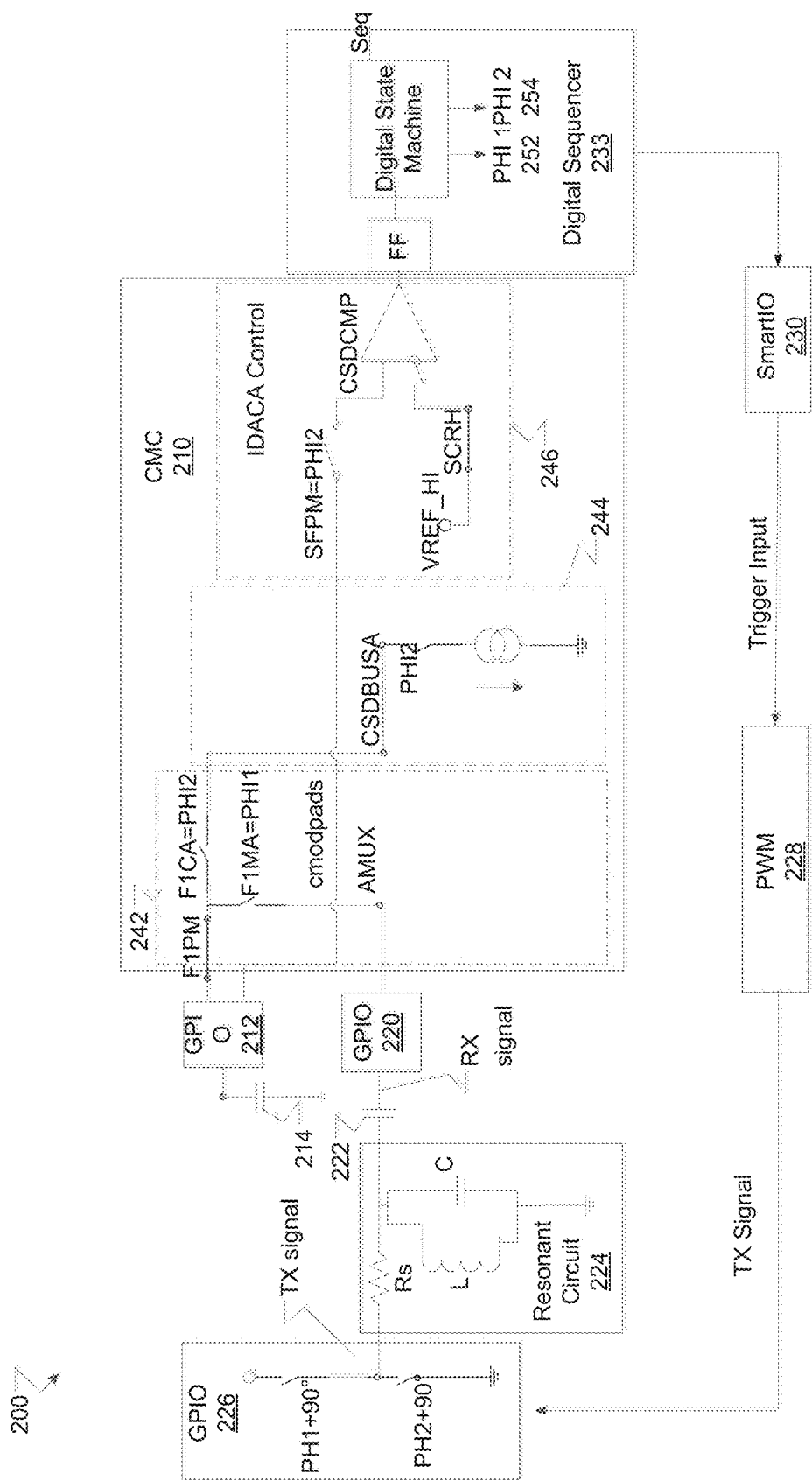
FIG. 2E illustrates the charge measurement circuit (CMC) of the device that is configured for half-wave capacitive sensing and inductive sensing according to an embodiment.

FIG. 2E illustrates the CMC 210 of the device 200 that is configured for half-wave capacitive sensing and inductive sensing according to an embodiment. Some of the features in FIG. 2E are the same or similar to some of the features in FIGS. 1 and 2A-2D as noted by the same reference numbers, unless expressly described otherwise.

When the device 200 is in the half-wave capacitive sensing and inductive sensing configuration, the GPIO 216 and the $C_{Tank}$ 218 may be removed from the device 200. The CMC 210 may include an analog multiplexer (AMUX) 242, a balancer 244, and a comparator 246. The AMUX 242 may combine the signals from the GPIO 212 and the GPIO 220 together and send the combined signal to the balancer 244.

The balancer 244 may balance current sources of the CMC 210. For example, the balancer 244 may be coupled to the digital sequencer 233 by a control line. The balancer 244 may send control signals to the digital sequencer 233 to balance the CMC. The balancer 244 may also include a timing network. The balancer 244 may also include a demodulator that determines the digital values of the CMC 210 and accumulates a charge for the resonant circuit 224, the $C_{Mod}$ 214, and the capacitor 222.

The comparator 246 may compare a digital value for the RX signal from the GPIO 220 to a digital representation of an amplitude of the reference signal of the comparator 246 to determine a difference between amplitudes of the RX signal and the reference signal. When the difference exceeds a threshold level, the difference may indicate a presence of an object proximate to the capacitor 222.

FIG. 3 illustrates a sense unit 300 where the resonant circuit 224 includes a resistor 332, an inductor 334, a capacitor 336, a second capacitor 338, and a ground 340, according to an embodiment. Some of the features in FIG. 3 are the same or similar to some of the features in FIGS. 1 and 2A-2E as noted by the same reference numbers, unless expressly described otherwise.

The resistor 332 may be coupled between the GPIO 226 and the node 342. The inductor 334, the capacitor 336, the second capacitor 338, and the ground 340 may be components of a series circuit 344 that may be coupled to the node 342. In one example, the capacitor 336 and/or the second capacitor 338 may be discrete components. In another example, the capacitor 336 and/or the second capacitor 338 may represent capacitances formed between components. For example, the capacitor 336 may represent a capacitance formed between inductor 334 and 340. The series circuit 344 may be coupled between the resistor 332 and the capacitor 222. The capacitor 222 may be coupled between the node 342 and the CMC 210.

In one embodiment, the series circuit 344 may include the inductor 334 that is in series with the capacitor 336 (i.e. L-C). The capacitor 336 may be connected to the ground 340. In another embodiment, the series circuit 344 may include the inductor 334 that is in parallel with the second capacitor 338 (i.e. L∥C). The inductor 334 and the second capacitor 338 may be coupled to the ground 340.

The combination of the inductor 334 and the second capacitor 338 may be in series with the capacitor 336 (i.e. L∥C-C). The capacitor 336 may be connected to the ground 340. The L∥C-C configuration may control the minimum and the maximum impedance of the resonant circuit 224. For example, the L∥C-C configuration may operate as an analog amplifier to control the frequency range between the minimum and the maximum impedance of the resonant circuit 224. The L∥C-C configuration may provide tuning for a resonant frequency of the sensing circuit.

The components of the series circuit 344 or the resonant circuit 224 are not intended to be limiting. The resonant circuit 224 may include other components or have other configurations.

Figure 4A:
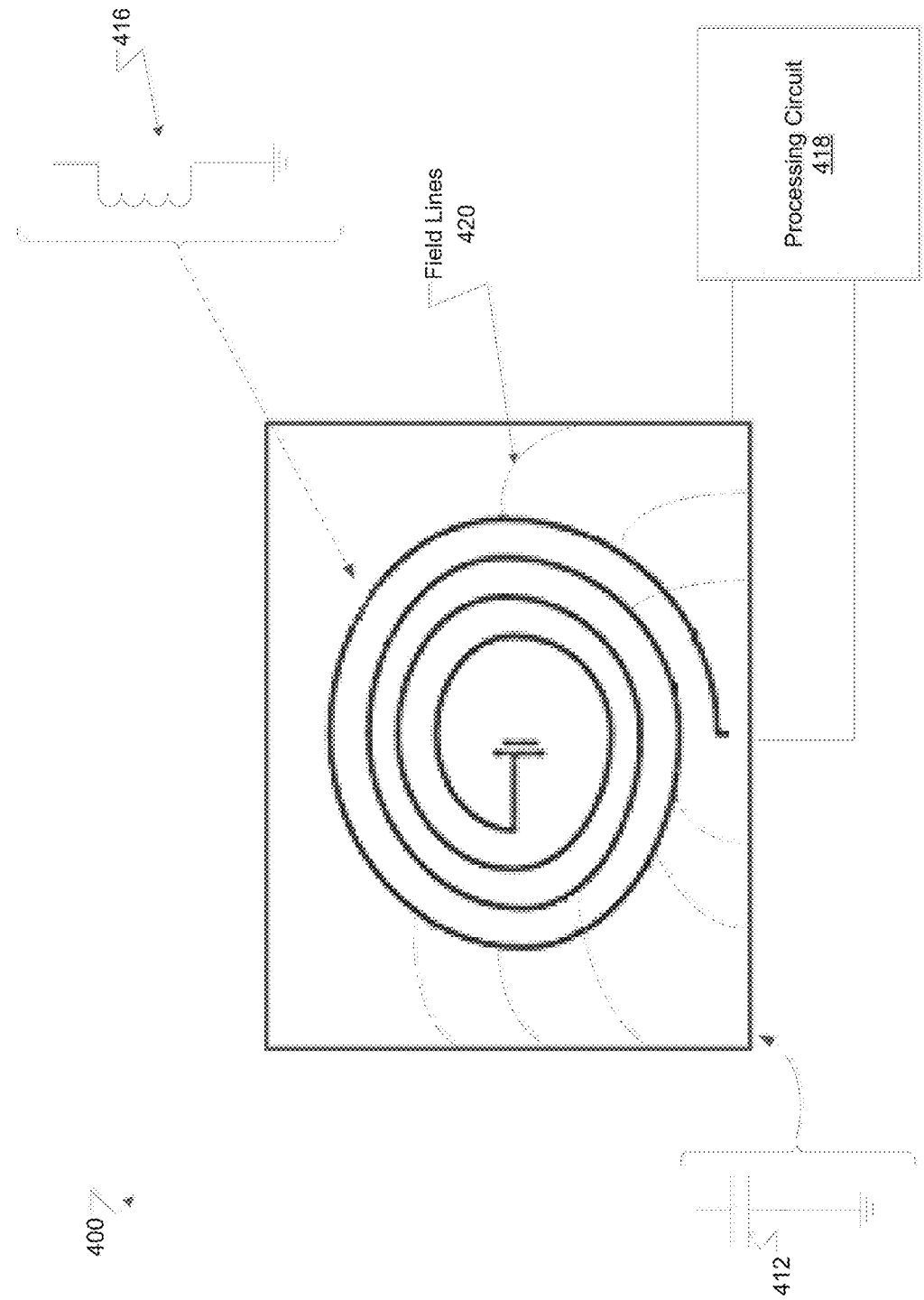
FIG. 4A illustrates the sense unit that includes a capacitor and an inductor, according to an embodiment.

FIG. 4A illustrates the sense unit 400 that includes a capacitor 412 and an inductor 416, according to an embodiment. The capacitor 412 and the inductor 416 may be coupled to a processing circuit 418. The Processing circuit 418 may use the inductor 416 to detect the presence of an object when operating in an inductive sensing mode.

In inductance sensing mode, the capacitor 412 may be a ground for the inductor 416. For example, in inductance sensing mode, a magnetic field may be generated at the inductor 416 and when a signal is applied to inductor 416, the magnetic field induces a current at the inductor 416. When an object comes in proximity to the magnetic field, the object may produce an Eddy current that opposes the magnetic field.

The processing circuit 418 may use the capacitor 412 to detect the presence of an object when operating in a capacitance sensing mode. The field lines 420 may illustrate the capacitance between the inductor 416 and the capacitor 412. In a self-capacitive sensing mode, a capacitance may be measured at the inductor 416. In a mutual capacitance sensing mode, capacitance may be measured between the inductor 416 and the capacitor 412. For example, the inductor 416 may not be excited when alternating current (AC) power is applied to the sense unit 400 and may act as a grounded metal.

In one embodiment, the capacitor 412 may be a parallel plate that is on a first side of a substrate. The capacitor 412 may be connected to a ground. The inductor 416 may be a spiral coil located on a second side of the substrate. The inductor 416 may be located on a second side of the substrate. In the inductive mode, the capacitor 412 may be grounded and inactive. In the capacitive mode, the ground of the inductor 416 couples the capacitive field to detect an object.

Figure 4B:
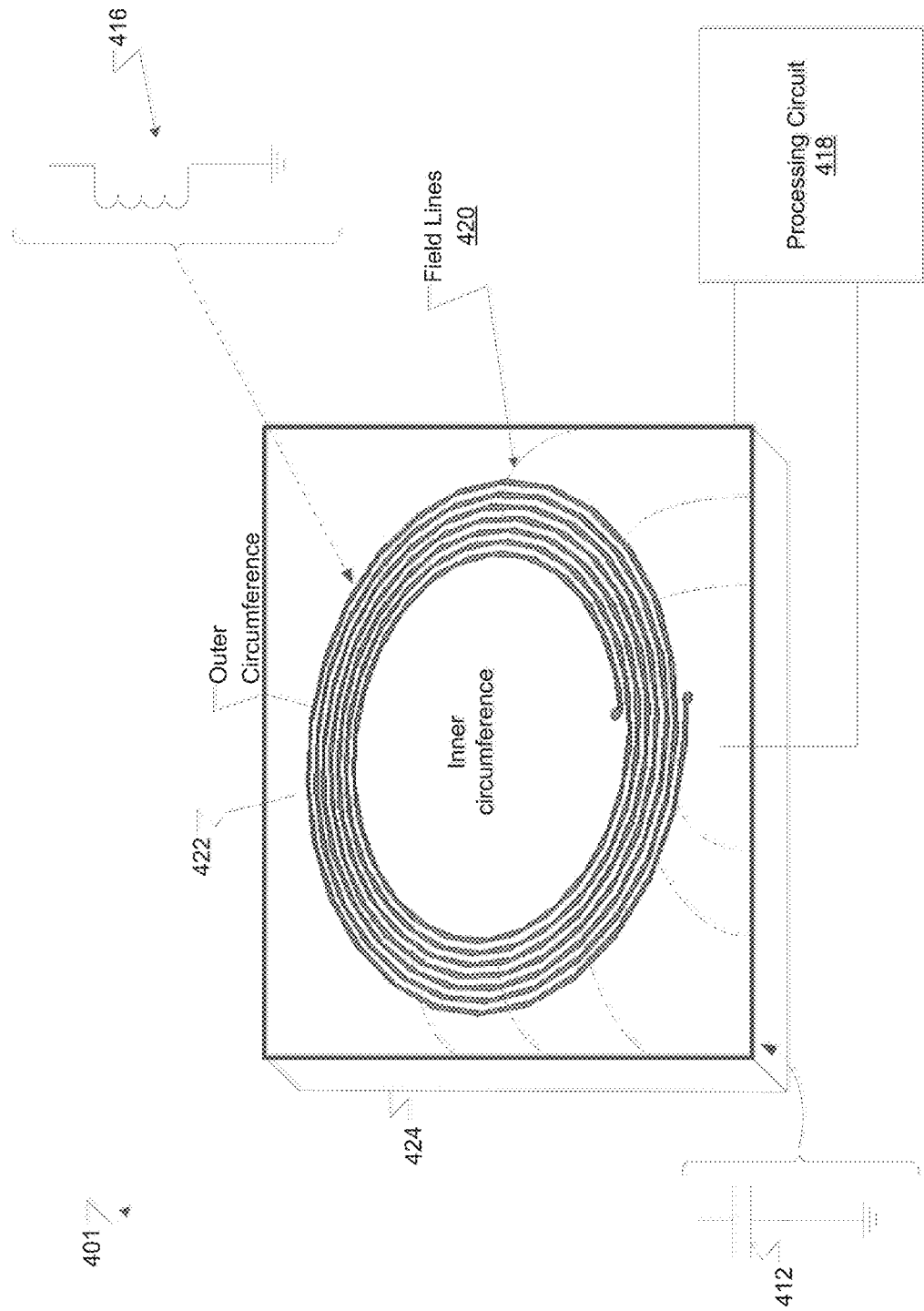
FIG. 4B illustrates the sense unit of FIG. 4A that includes a flat coil, according to an embodiment.

FIG. 4B illustrates the sense unit 401 of FIG. 4A that includes a flat coil 422, according to an embodiment. Some of the features in FIG. 4B are the same or similar to some of the features in FIG. 4A as noted by the same reference numbers, unless expressly described otherwise. The flat coil 422 may act as the inductor 416, such as a planar inductor. The flat coil 422 may have a relatively large inner diameter compared to the outer diameter of the flat coil 422. The relatively large inner diameter compared to the outer diameter of the flat coil 422 may provide a relatively small capacitance coupling with an object proximate to the flat coil 422 because of the reduced surface area of the flat coil 422. The flat coil 422 may be coupled to a ground plate 424. In one example, the ground plate 424 may be located on a top side or a bottom side of the flat coil.

Figure 4C:
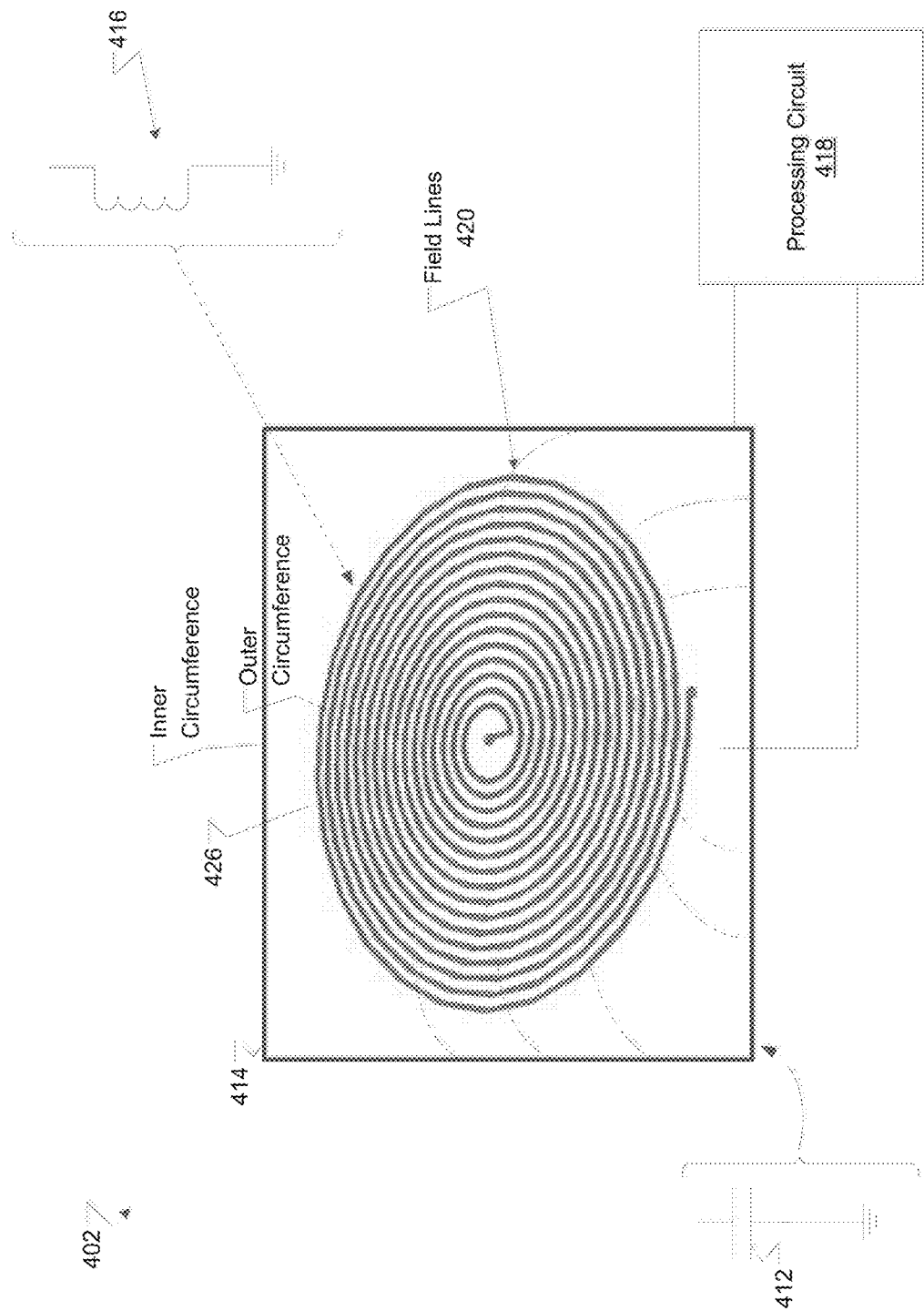
FIG. 4C illustrates the sense unit of FIG. 4A that includes a flat coil with a small inner circumference, according to an embodiment.

FIG. 4C illustrates the sense unit 402 of FIG. 4A that includes a flat coil 426 with a small inner circumference, according to an embodiment. Some of the features in FIG. 4C are the same or similar to some of the features in FIG. 4A as noted by the same reference numbers, unless expressly described otherwise. The flat coil 426 may act as the inductor 416. The flat coil 426 may have a relatively small inner diameter compared to the outer diameter of the flat coil 426. The relatively small inner diameter compared to the outer diameter of the flat coil 426 may provide a relatively high capacitance coupling with an object proximate to the flat coil 426 because of an increased surface area of the flat coil 426.

Figure 4D:
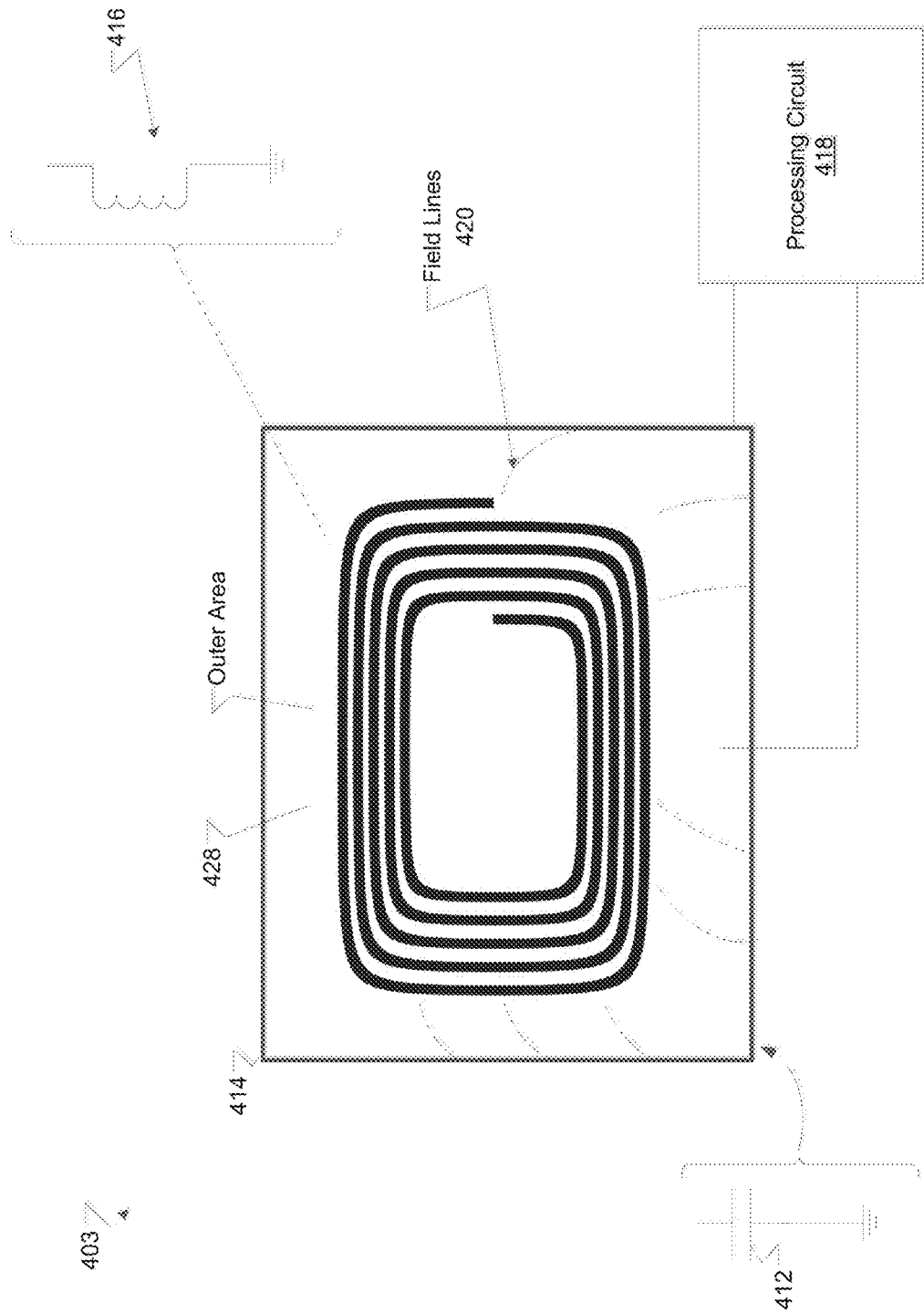
FIG. 4D illustrates the sense unit of FIG. 4A that includes a rectangle coil, according to an embodiment.

FIG. 4D illustrates the sense unit 403 of FIG. 4A that includes a rectangle coil 428, according to an embodiment. Some of the features in FIG. 4D are the same or similar to some of the features in FIG. 4A as noted by the same reference numbers, unless expressly described otherwise. The rectangle coil 428 may act as the inductor 416. The rectangle coil 428 may have a relatively small inner area compared to the outer diameter of the rectangle coil 428. The relatively small inner area compared to the outer area of the flat coil 426 may provide a relatively high capacitance coupling with an object proximate to the rectangle coil 428 because of the increased surface area of the rectangle coil 428.

Figure 4E:
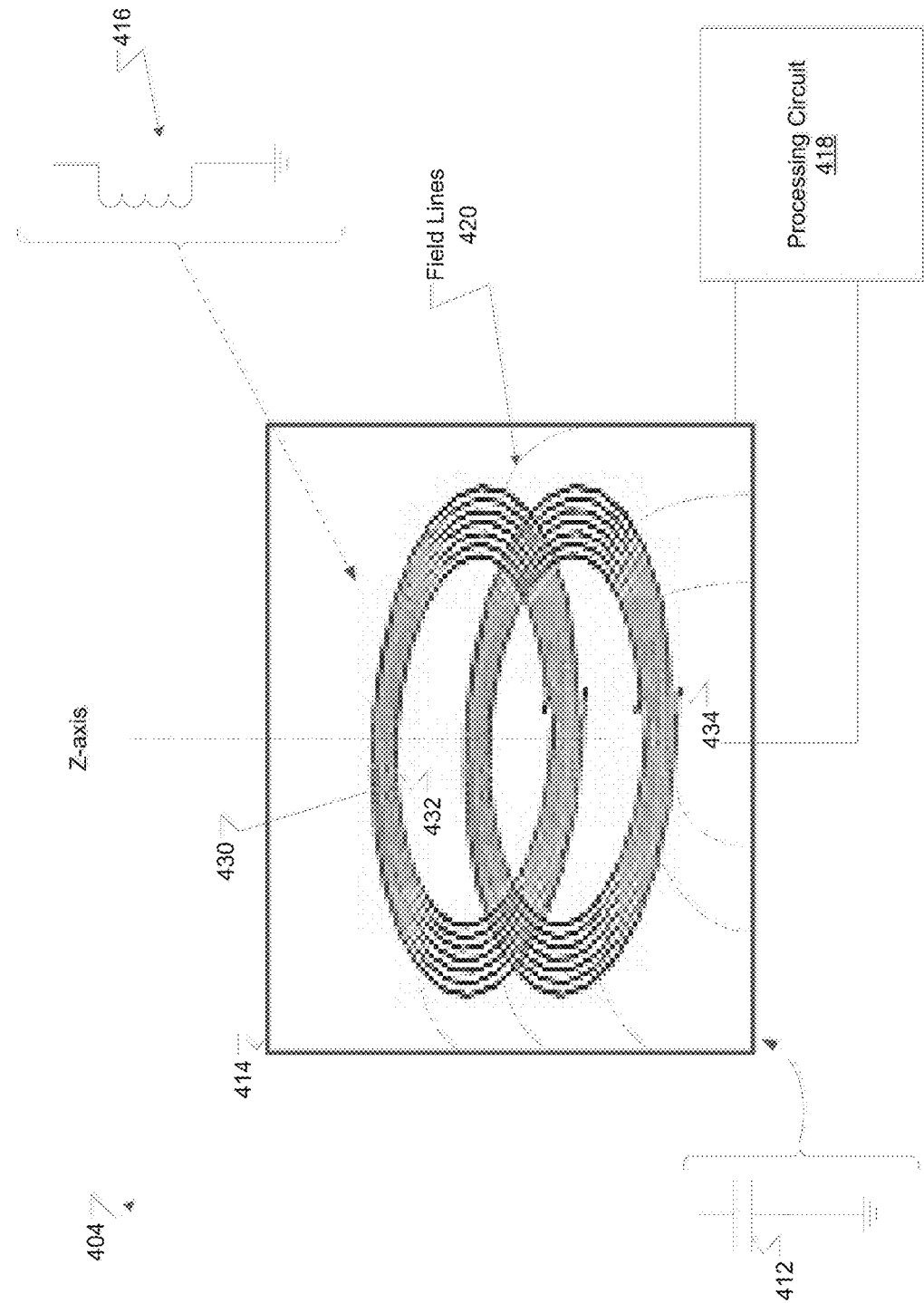
FIG. 4E illustrates the sensing unit of FIG. 4A that includes a multiple layer coil, according to an embodiment.

FIG. 4E illustrates the sensing unit 404 of FIG. 4A that includes a multiple layer coil 430, according to an embodiment. Some of the features in FIG. 4E are the same or similar to some of the features in FIGS. 2 and 4A as noted by the same reference numbers, unless expressly described otherwise. The multiple layer coil 430 may include a first coil 432 and a second coil 434. The first coil 432 may be located above the second coil 434 along a Z axis. In one example, when the sense unit 400 is used for capacitance sensing, the coil 432 may be used for coupling with the capacitor 412. In another example, when the device 200 is used for inductance sensing, the coil 432 and the coil 434 may be used for inductive coupling.

Figure 4F:
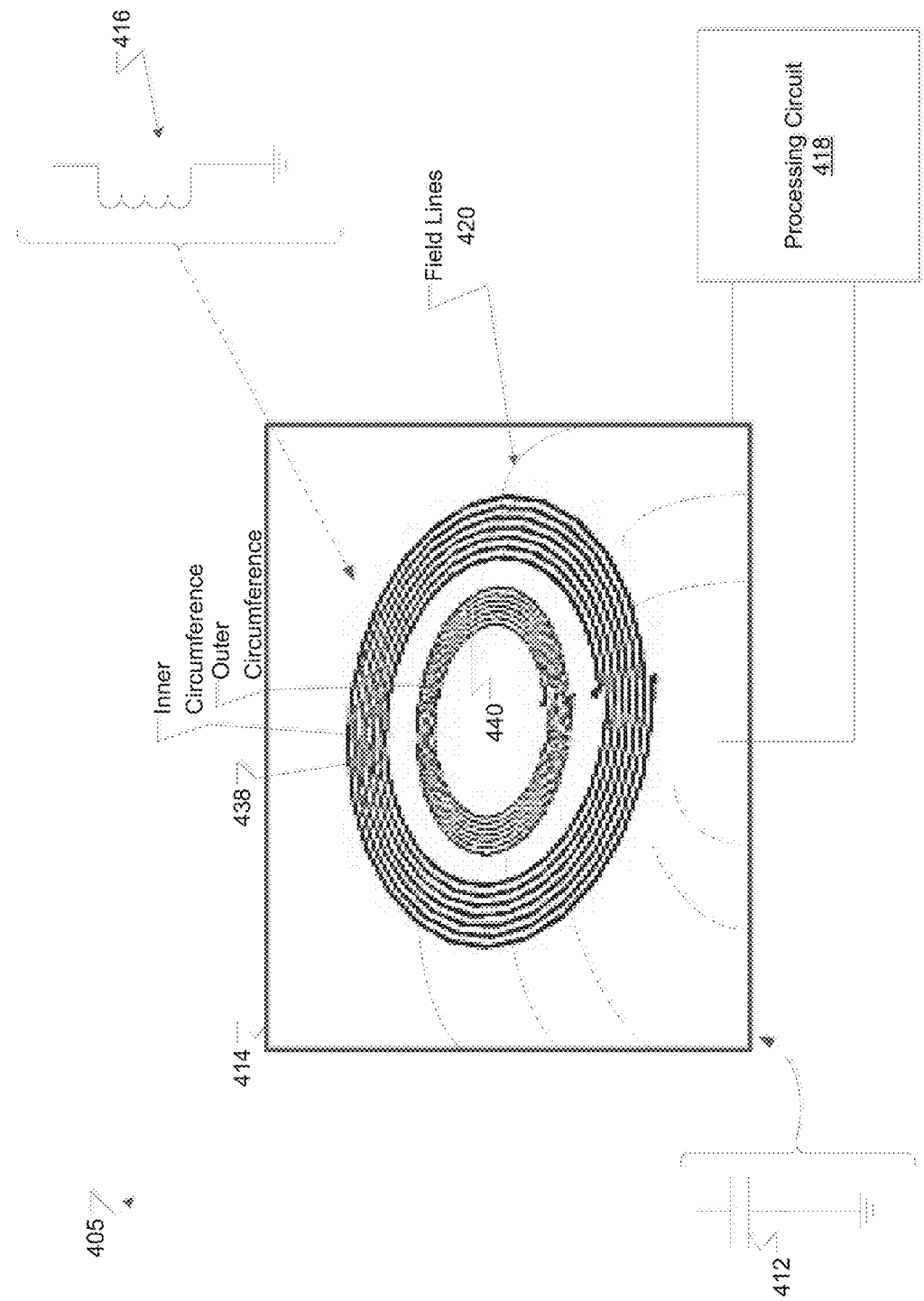
FIG. 4F illustrates the sense unit of FIG. 4A that includes a primary coil and a secondary coil, according to an embodiment.

FIG. 4F illustrates the sense unit 405 of FIG. 4A that includes a primary coil 438 and a secondary coil 440, according to an embodiment. Some of the features in FIG. 4F are the same or similar to some of the features in FIG. 4A as noted by the same reference numbers, unless expressly described otherwise. An outer circumference of the secondary coil 440 may be less than an inner circumference of the primary coil 438. The secondary coil 440 may be coplanar and located within the inner circumference of the primary coil 438.

Figure 4G:
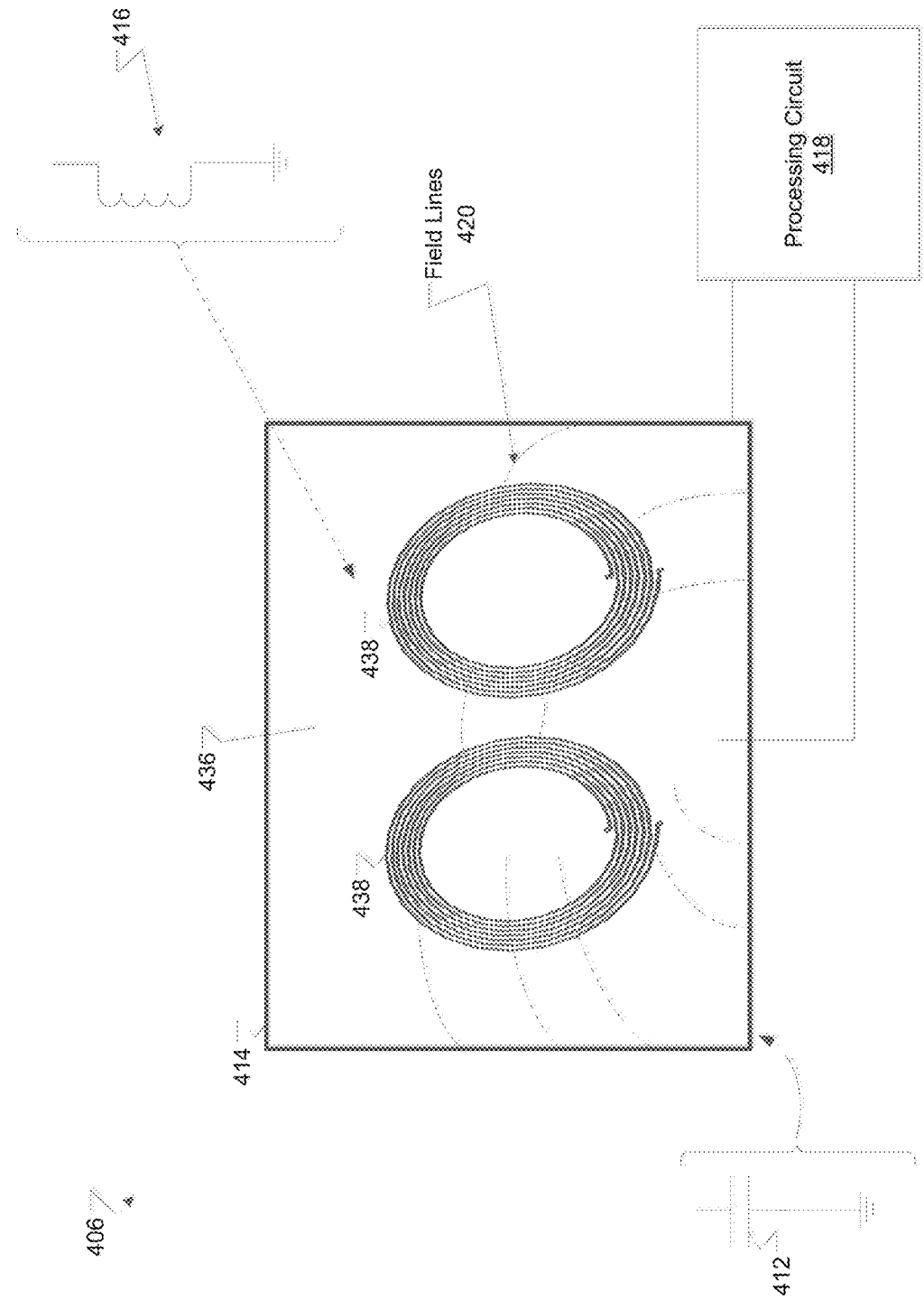
FIG. 4G illustrates the sense unit of FIG. 4A that includes the primary coil 438 and the secondary coil that are coplanar, according to an embodiment.

FIG. 4G illustrates the sense unit 406 of FIG. 4A that includes the primary coil 438 and the secondary coil 440 that are coplanar, according to an embodiment. Some of the features in FIG. 4G are the same or similar to some of the features in FIGS. 2, 4A, and 4H as noted by the same reference numbers, unless expressly described otherwise. An outer circumference of the secondary coil 440 may be approximately the same as the outer circumference of the primary coil 438. The secondary coil 440 may be located coplanar and adjacent to the primary coil 438. The implementations in FIGS. 4A-4G are not intended to be limiting. For example, the sense unit 400 may include a spiral coil, a solenoid coil, a triangle coil, a stretched coil, and so forth.

Figure 5:
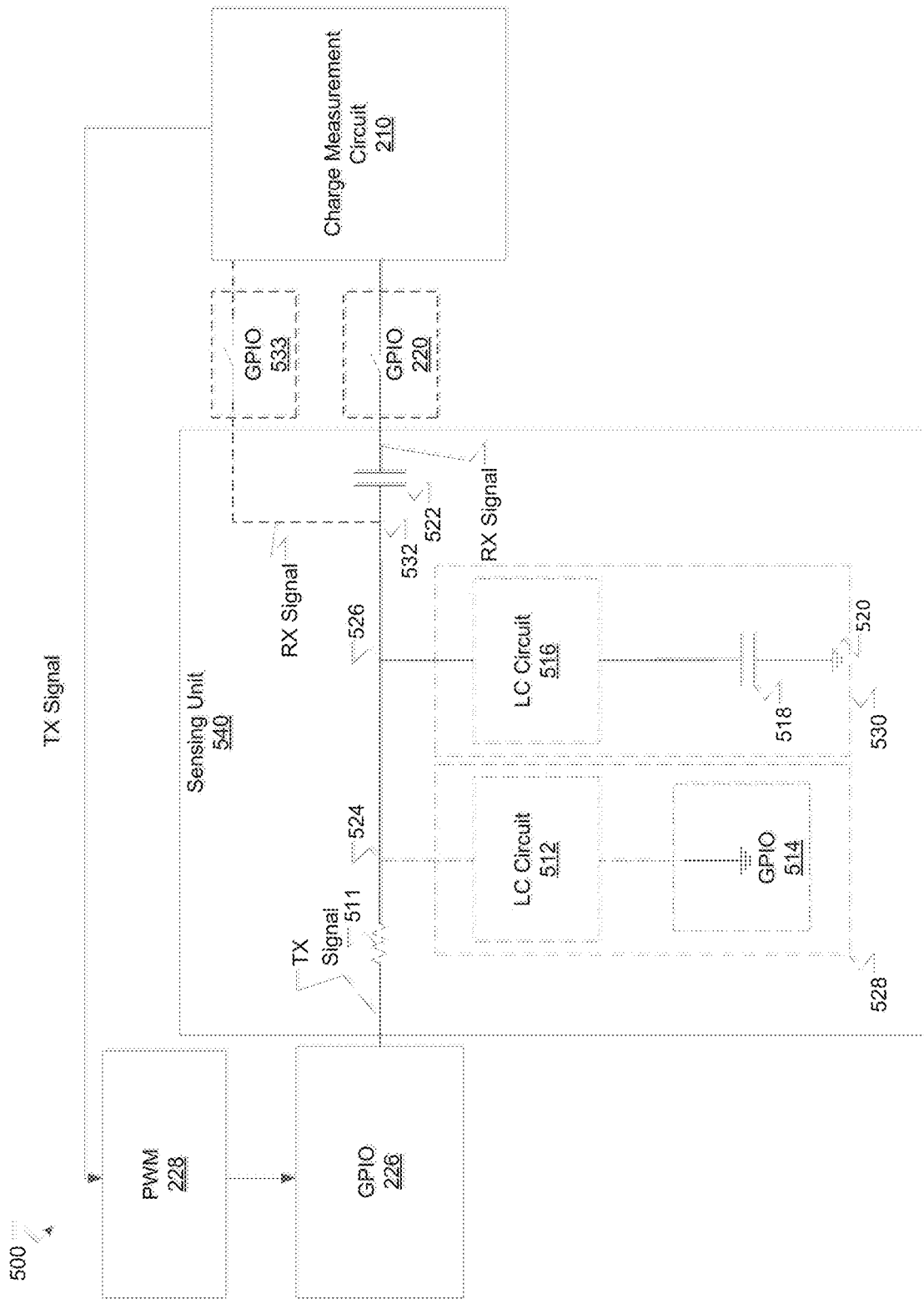
FIG. 5 illustrates a sensing circuit with a hybrid capacitive and inductive sensor, according to an embodiment.

FIG. 5 illustrates a sensing circuit 500 with a hybrid capacitive and inductive sensor, according to an embodiment. Some of the features in FIG. 5 are the same or similar to some of the features in FIGS. 1 and 2A-2E as noted by the same reference numbers, unless expressly described otherwise.

The sensing circuit 500 may include the PWM 228, the GPIO 226, and a sense unit 540. The sense unit 540 may include at least one of a resistor 511, a first LC circuit 512, a GPIO 514, a second LC circuit 516, a capacitor 518, a ground 520, a capacitor 522, the GPIO 533, the GPIO 220, or the CMC 210. The first LC circuit 512, the second GPIO 514, the second LC circuit 516, the GPIO 533, and the GPIO 220 may be configurable to provide various configurations of the sensing circuit 500 for capacitive sensing and inductive sensing.

The CMC 210 may include a signal generator. The signal generator may generate a TX signal. In one example, the TX signal may be a square wave signal. An initial phase of the TX signal generated by the signal generator may be relative to a reference signal at the CMC 210. The phase shifter of the PWM 228 may control a phase of the TX signal. The CMC 210 may use the sense unit 540 for capacitive sensing when there is not a phase shift. The CMC 210 may use the sense unit 540 for inductive sensing when there is a phase shift.

The GPIO 226 may be a driver to adjust an amplitude of the TX signal. The GPIO 226 may be coupled to the resistor 511. The TX signal may be sent to the CMC 210 as an RX signal via the resistor 511, a first circuitry 528, a second circuitry 530, the capacitor 522, the GPIO 220, and/or the GPIO 533. The TX signal may excite the resistor 511, a first circuitry 528, a second circuitry 530, the capacitor 522, the GPIO 220, and/or the GPIO 533.

In one embodiment, the resistor 511 may be coupled to a node 524. In another embodiment, a first circuitry 528 may be coupled to the node 524. The LC circuit 512 and the GPIO 514 may be part of the first circuitry 528. The GPIO 514 may include a ground or may be coupled to a ground. The LC circuit 512 and the GPIO 514 may be connected in a series. The first circuitry 528 may be series to the resistor 511.

In another embodiment, the resistor 511 or the first circuitry 528 may be coupled in parallel to a node 526. For example, the second LC circuit 516 and the capacitor 518 may be part of a second circuitry 530 that is coupled to the node 526. The capacitor 518 may also be coupled to a ground. The second LC circuit 516 and the capacitor 518 may be connected in series. In one embodiment, the second circuitry 528 may be in series with the resistor 511. In another embodiment, the second circuitry 528 may be parallel to the first circuitry 528.

The resistor 511, the first circuitry 528, and/or the second circuitry 530 may be coupled to a node 532. The capacitor 522 may be coupled to the node 532 in series with the resistor 511, the first circuitry 528, and/or the second circuitry 528. The GPIO 220 may be coupled in series with the capacitor 522 and the CMC 210. In one embodiment, the GPIO 533 may be coupled to the node 532 and may be in parallel with the capacitor 522 and the GPIO 220. The GPIO 533 may also be coupled to the CMC.

When the TX signal is sent across the resistor 511, the first circuitry 528 and/or the second circuitry 528, and the capacitor 522, the resulting signal may be referred to as an RX signal. The GPIO 220 and/or the GPIO 533 may couple the RX signal received from the GPIO 226 via the resistor 511, the first circuitry 528, and/or the second circuitry 528 into the CMC 210. The CMC 210 may compare the digital value corresponding to the RX signal with a digital value of a reference signal to determine whether there is a relative difference between an amplitude of the RX signal and an amplitude of the reference signal that exceed a threshold value. When the relative difference between the representative amplitudes of the RX signal and the reference signal exceeds the threshold amount, the difference may indicate a presence of an object proximate to the device 200.

In one example, when a difference between the RX signal and the reference signal does not exceed the threshold amount, the difference may indicate an object is not proximate to the sensing circuit 500, such as the LC circuit 512 or the LC circuit 516. In another example, when a difference between the RX signal and the reference signal does not exceed a threshold amount, the sensing circuit 500 may not be configured to sense the type of object proximate to the device 200 and may not indicate that an object is proximate to the sensing circuit 500. In one example, when the sensing circuit 500 is configured to perform capacitive sensing, the sensing circuit 500 may be able to sense ferrous or non-ferrous conductive objects. In another example, when the sensing circuit 500 is configured to perform inductive sensing, the sensing circuit 500 may be able to sense conductive objects at a potential. The sensing circuit 500 may use the first circuitry 528 and/or 530 to perform the inductive sensing and the capacitor 522 to perform the capacitive sensing. The components of the first circuitry 528 or 530 are not intended to be limiting. FIGS. 6A-6D illustrates different implementations of the resonant circuits 528 and 530 and the GPIOs 533 and 220, as discussed below.

Figure 6A:
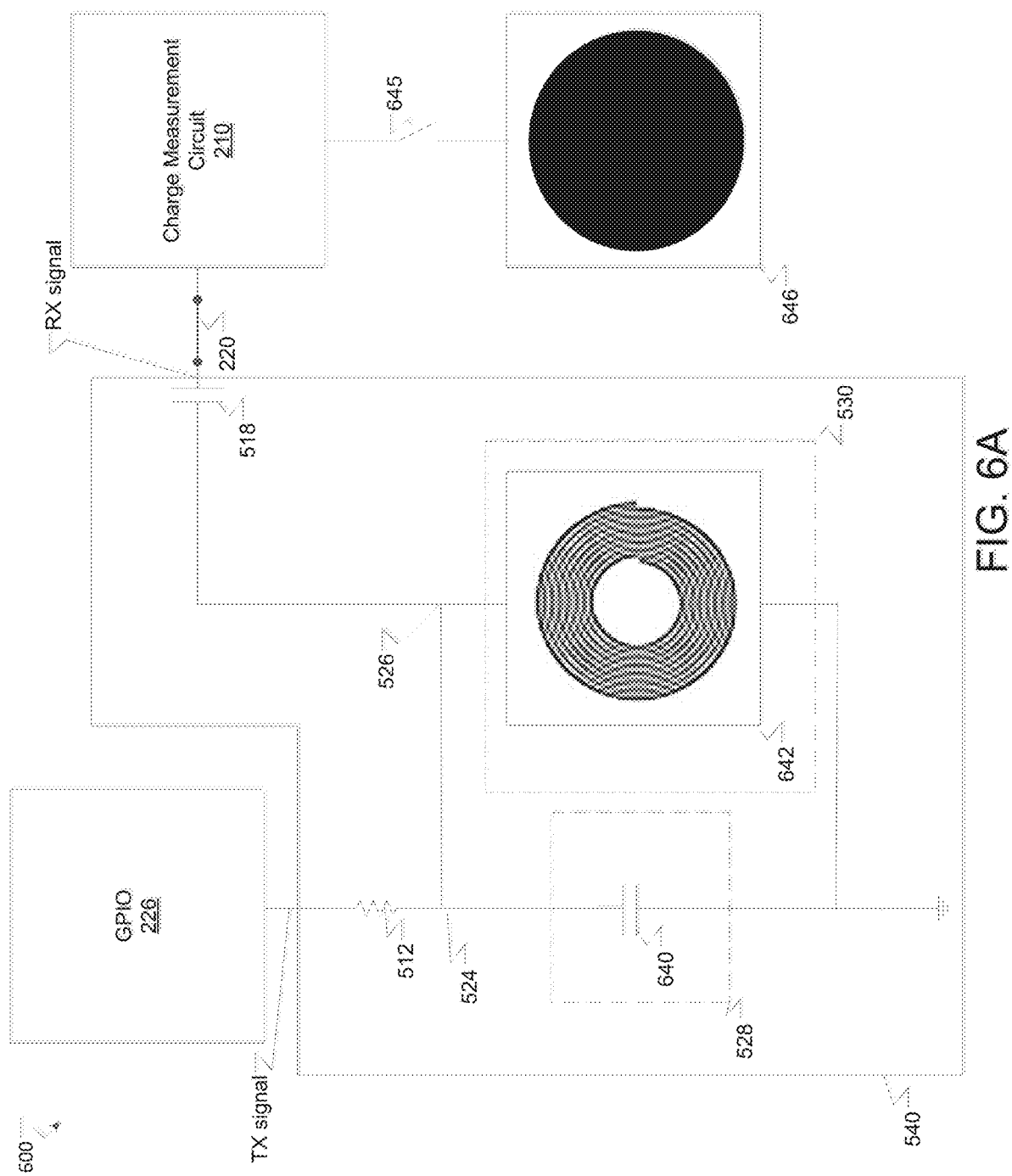
FIG. 6A illustrates the sense unit of FIG. 5 that includes the first circuitry with a capacitor and the second circuitry with an inductor, according to an embodiment.

FIG. 6A illustrates sensing circuit 600 including the sense unit 540 of FIG. 5 that includes the first circuitry 528 with a capacitor 640 and the second circuitry 530 with an inductor 642, according to an embodiment. In one embodiment, sensing circuit may be referred to as a two sensor hybrid sensing circuit, which may be configured respectively for inductive sensing and capacitive sensing. Some of the features in FIG. 6A are the same or similar to some of the features in FIG. 5 as noted by the same reference numbers, unless expressly described otherwise. The resistor 511 and the first circuitry 528 may be connected in series and may be connected to the node 524. The node 524 may be connected to node 526. The second circuitry 530 may be connected to the node 526. The second circuitry 530 may also be connected in parallel with the first circuitry 528. The inductor 642 of the first circuitry 530 may be a first electrode. The first circuitry 528 and the second circuitry 530 may be connected to a common alternating current (AC) ground.

The capacitor 518 may be connected between the node 526 and the GPIO 220. The GPIO 220 may be connected to the CMC 210. The CMC 210 may be connected to the resonant circuit 646 by a switch 645. When the switch 645 is open, the resonant circuit 646 is disconnected from the CMC 210. When the switch 645 is closed, the resonant circuit 646 may be coupled to the CMC 210. In one embodiment, the resonant circuit 646 is a second electrode.

When sensing circuit 600 is configured for inductive sensing, the first circuitry 528 and the second circuitry 530 may be connected to the CMC 210 via the capacitor 518. The CMC 210 and the GPIO 226 may be configured for inductive sensing mode. In one example, a metal object proximate to the sensing circuit 600, such as capacitor 640 in parallel with the inductor 642 may have an impact on the amplitude and phase of the LC circuitry including first circuitry 528 and inductor 642, which can be detected by the CMC 210. The CMC 210 may detect the relative change in the amplitude of the RX signal which may be detected by the CMC 210 in the inductive sensing configuration.

In one embodiment, when the sensing circuit 600 is configured for inductive sensing, the resonant circuit 646 may be disconnected from the CMC 210 by switch 645. For example, the resonant circuit 646 may be an electrode and the switch 645 may set the electrode connection either to ground or to high-Z. The CMC 210 and the GPIO 226 may be configured for inductive sensing. The CMC 210 may use the RX signal that is received at the GPIO 220 to detect ferrous or non-ferrous metal objects that change an amplitude of the RX signal.

In another embodiment, the second circuitry 530 may be a flat circular shaped electrode. In another embodiment, the resonant circuit 646 may be a spiral shaped electrode. The shape of the electrodes is not intended to be limiting. For example, the electrodes may be shaped to have a threshold level of capacitive coupling between the inductor 642 and the resonant circuit 646 for capacitive sensing.

Figure 6B:
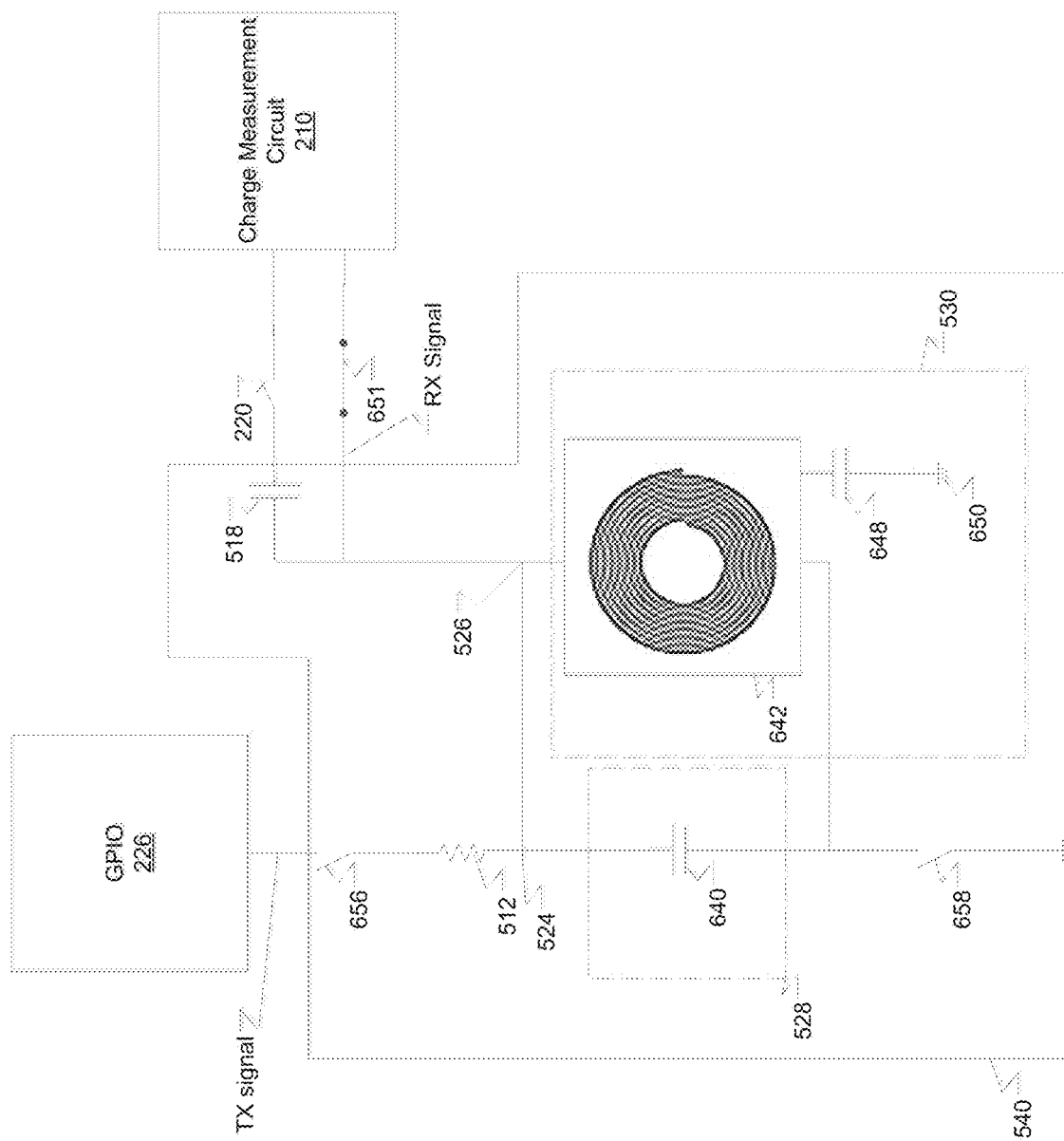
FIG. 6B illustrates the sense unit of FIG. 5 that includes the first circuitry with the capacitor and the second circuitry with the inductor, a capacitor, and a ground, according to an embodiment.

FIG. 6B illustrates an embodiment of an one sensor hybrid sensing circuit of the sense unit 540 of FIG. 5 that includes the first circuitry 528 with the capacitor 640 and the second circuitry 530 with the inductor 642, a capacitor 648, and a ground 650, according to an embodiment. In alternative embodiments, the one sensor hybrid sensing circuit may be configured for capacitive sensing (in FIG. 6B) and inductive sensing (in FIG. 6C). Some of the features in FIG. 6B are the same or similar to some of the features in FIGS. 5 and 6A as noted by the same reference numbers, unless expressly described otherwise.

The resistor 511 and the first circuitry 528 may be connected in series at the node 524. The node 524 may be connected to node 526. The second circuitry 530 may be connected to the node 526. The second circuitry 530 may include the inductor 642, the capacitor 648, and the ground 650 connected in a series.

The second circuitry 530 may also be connected in parallel with the first circuitry 528. In one embodiment, second circuitry 530 may be connected in series with the first circuitry 528 (not shown in FIG. 6B). The capacitor 518 may be connected between the node 526 and the GPIO 220. In one example, the GPIO 220 may be a switch with an open position and a closed position. When the switch is closed the capacitor 518 is connected to the CMC 210. When the switch is opened the capacitor 518 is disconnected from the CMC 210. The GPIO 651 may also be a switch. When the GPIO 651 is closed, the CMC 210 may be connected directly to node 526. When the GPIO is open, the CMC 210 may be disconnected from the node 526. In one embodiment, the first circuitry 528 and the second circuitry 530 may be connected to the CMC 210 via coupling capacitor 518 and the GPIO 651 may be open.

When the sensing unit 540 is configured for capacitance sensing, the capacitor 518 may be bypassed with GPIO 220. The switch 656 disconnects the inductive sensing circuitry from receiving the TX signal and sets the inactive GPIO 226 connection to a High-Z. The switch 658 disconnects a ground from the sensing circuit 500 and sets the inactive ground connection to high-Z. In this configuration, the CMC 210 may be configured for self-capacitive sensing (C S D), where the inductor 642 may be configured as a self-capacitance electrode. Object approximate to the inductor 642 may alter the self-capacitance of inductor 642 which may be detected by the CMC 210 operating in the CSD configuration.

Figure 6C:
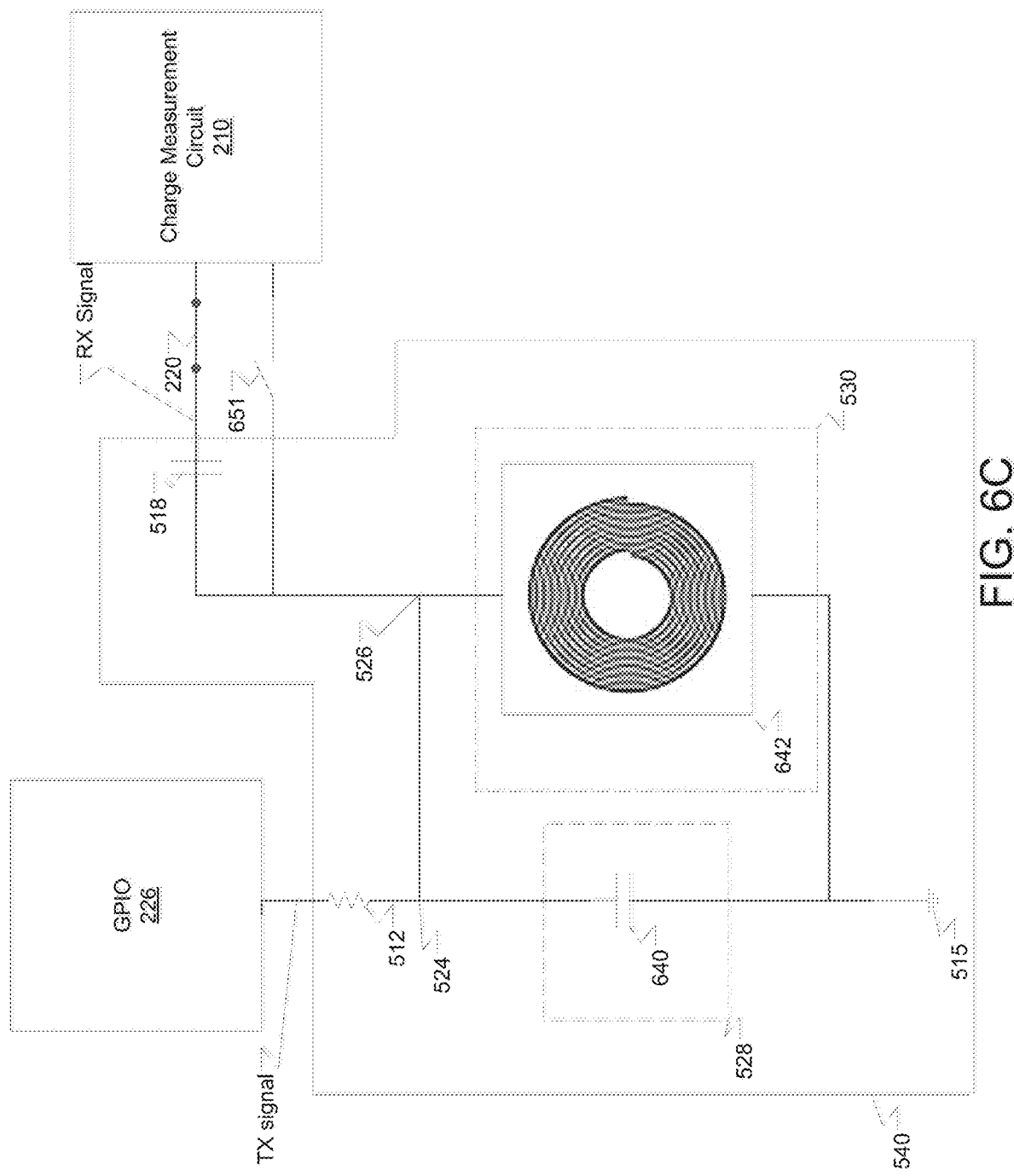
FIG. 6C illustrates the sense unit where the GPIO is open and the GPIO is closed, according to an embodiment.

FIG. 6C illustrates the sense unit 540 where the GPIO 651 is open and the GPIO 220 is closed, according to an embodiment. The embodiment in FIG. 6C may be similar to the one sensor hybrid sensing circuit in FIG. 6B but configured for inductive sensing. Some of the features in FIG. 6C are the same or similar to some of the features in FIGS. 5, 6A, and 6B as noted by the same reference numbers, unless expressly described otherwise. The resistor 511 and the first circuitry 528 may be connected in series by the node 524. The first circuitry 528 may be the capacitor 640. The node 524 may be connected to node 526. The second circuitry 530 may be connected to the node 526. The second circuitry 530 may include the inductor 642. The first circuitry 528 and the second circuitry 530 may be connected in parallel and may be connected to an AC ground. In an alternative embodiment, the first circuitry 528 and the second circuitry 530 may be connected in series.

The capacitor 518 may be connected to the node 526 and the GPIO 220. In one example, the GPIO 220 may be a switch with an open position and a closed position. When the switch is in the closed position the capacitor 518 is connected to the CMC 210. When the switch is in the open position the capacitor 518 is disconnected from the CMC 210. The GPIO 651 may also be a switch. When the GPIO 651 is closed the CMC 210 may be directly connected to node 526. When the GPIO is open the CMC 210 may be disconnected from the node 526 or may be connected to the node 526 via the GPIO 220.

In one embodiment, when the sense unit 540 is configured for inductive sensing, the inductor 642 may be connected to the CMC 210 by GPIO 220. GPIO 651 may be open. The CMC 210 and the GPIO 226 may be configured for inductive sensing. The CMC 210 may use the RX signal that is received at the GPIO 220 to detect ferrous or non-ferrous metal objects that change an amplitude of the RX signal.

Figure 6D:
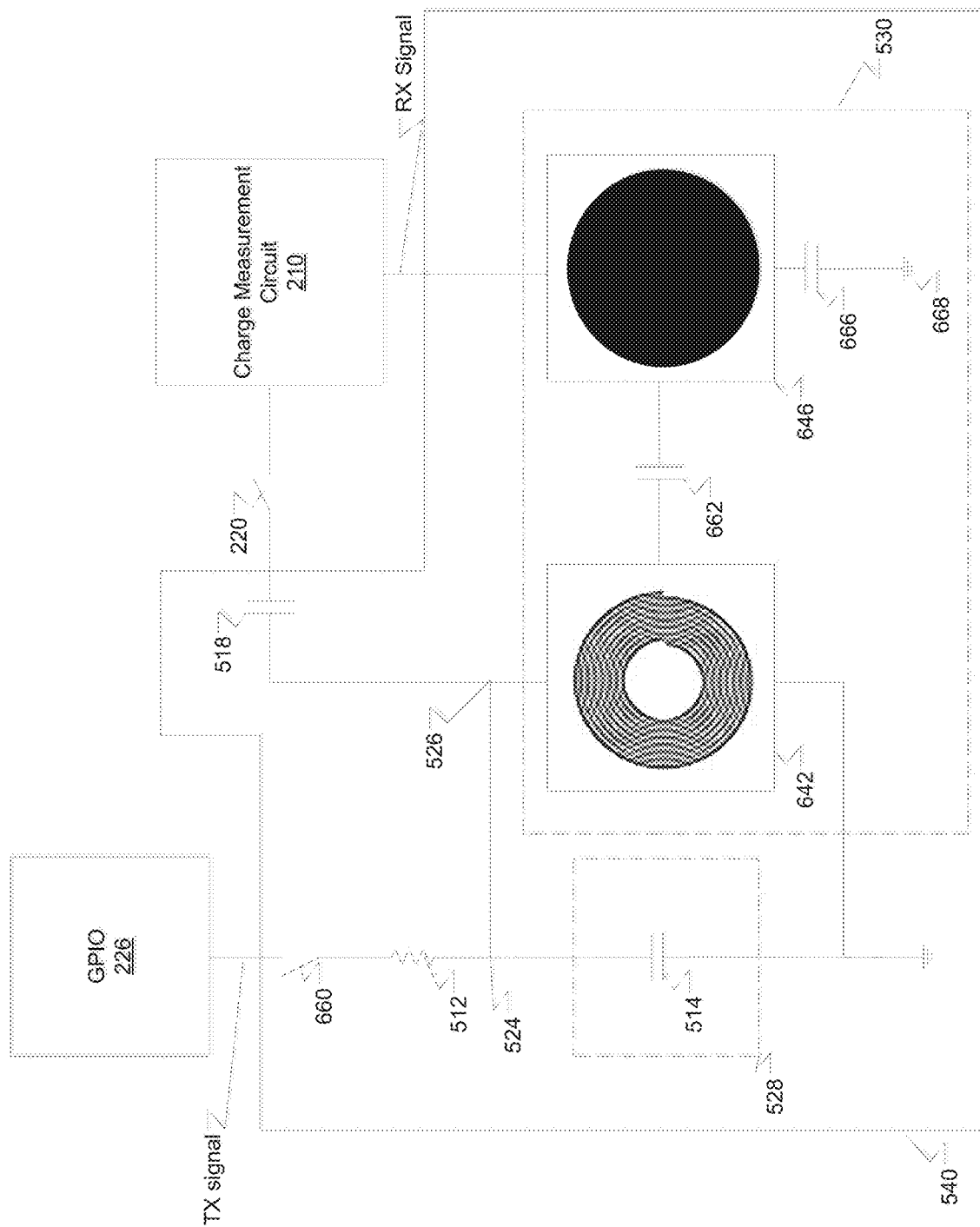
FIG. 6D illustrates the sense unit of FIG. 5 that includes a first circuitry with a capacitor and the second circuitry with the inductor, a capacitor, an inductor, a capacitor, and a ground, according to an embodiment.

FIG. 6D illustrates the sense unit 540 of FIG. 5 that includes a first circuitry 528 with a capacitor 514 and the second circuitry 530 with the inductor 642, a capacitor 662, an inductor 664, a capacitor 666, and a ground 668, according to an embodiment. The embodiment in FIG. 6D may be similar to the two sensor hybrid sensing circuit shown in FIG. 6A but configured for capacitive sensing. Some of the features in FIG. 6D are the same or similar to some of the features in FIGS. 1, 2, 5, 6A, 6B, and 6C as noted by the same reference numbers, unless expressly described otherwise.

The GPIO 226 may be connected to a switch 660. When the switch 660 is in the closed position, the GPIO 226 is connected to the resistor 511. When the switch 660 is open the GPIO 226 is disconnected from the GPIO 226. The resistor 511 and the first circuitry 528 may be connected in series by the node 524. The first circuitry 528 may be the GPIO 514.

The node 524 may be connected to the node 526. The second circuitry 530 may be connected to the node 526. The second circuitry 530 may also be connected in parallel with the first circuitry 528. The inductor 642 and capacitor 640 may be connected to an AC ground. The second circuitry 530 may include the inductor 642, the capacitor 662, the inductor 664, the capacitor 666, and the ground 668. The inductor 642 may be coupled in series with the capacitor 662. The capacitor 662 may be coupled in series with the resonant circuit 646. The inductor 664 may be coupled in series with the capacitor 666. The capacitor 666 may be coupled in series with the ground 668.

The capacitor 518 may be connected between the node 526 and the GPIO 220. The GPIO 220 may be connected to the CMC 210. When the GPIO 220 is in an open position, the capacitor 518 may be disconnected from the CMC 210. When the GPIO 220 is in a closed position the capacitor may be connected to the CMC 210.

In one embodiment, when the sense unit 540 is configured for capacitance sensing, the resonant circuit 642 may be disconnected from the CMC 210 by GPIO 220 and third resonant circuit 642 may be connected to the CMC 210 via the capacitor 662 and the resonant circuit 646. For example, the GPIO 220 may set the third resonant circuit 642 to ground or to High-Z. The switch 660 may disconnect the GPIO 226 so that the sense unit 540 does not receive the TX signal. The switch 660 may set the connection for the TX signal to ground or to high-Z.

In one embodiment, when the CMC 210 is configured for self-capacitive sensing, the third resonant circuit 642 may be grounded and be configured as a second electrode to couple with the resonant circuit 646. The CMC 210 may use the RX signal that is received to detect conductive objects that may change a capacitive field between the third resonant circuit and the resonant circuit 646.

Figure 7:
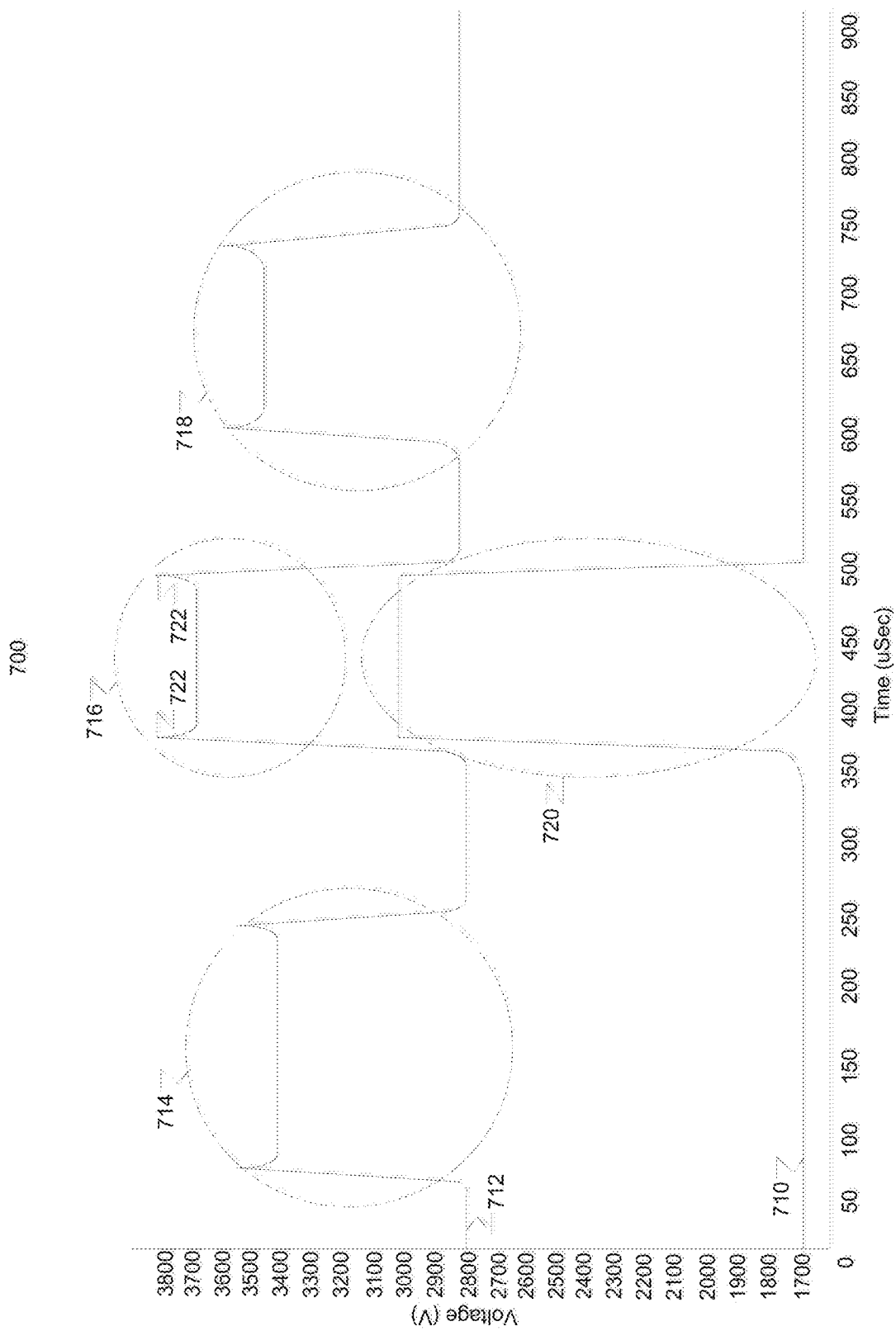
FIG. 7 illustrates a graph of an amplitude change associated with a digital representation of the RX signal, according to an embodiment.

FIG. 7 illustrates a graph 700 of an amplitude change 720 associated with a digital representation of the RX signal 712, according to an embodiment. The graph 700 shows a digital representation of the RX signal 712 that is received at the CMC 210 in FIG. 2A. The resonant circuit 224 and the capacitor 222 of FIG. 2A may receive a TX signal at time period 714 and may be excited by the TX signal.

At time period 714, line 710 shows no relative change between the amplitudes the RX signal and the reference signal. No relative change may indicate that no object may be detected by the CMC 210 when performing capacitive sensing for the non-phased shifted signal, as discussed above. At time period 716, the PWM 228 may shift the phase of the TX signal by approximately 90 degrees. At time period 716, line 710 shows a relative change between the amplitudes of the RX signal and the reference signal. The relative change may indicate that an object may be detected by the CMC 210 when performing inductive sensing using the phase-shifted signal, as discussed above. In one embodiment, the peaks 722 of the RX signal 712 may show a period of time where an object is being placed proximate to the device 200.

At time period 718, the PWM 228 may shift the phase of the TX signal back to approximately 0 degrees. At time period 718, line 710 shows no relative change in an amplitude between the RX signal and the reference signal. No relative change may indicate that object may not be detected by the CMC 210 when performing capacitive sensing using the non-phase shifted signal, as discussed above.

In one embodiment, the PWM 228 may alternate between sending a TX signal with a 0-degree phase and a phase-shifted TX signal. A timing of the CMC 210 may be synchronized to alternate a phase of the TX signal so that the CMC 210 may be set to perform capacitive sensing or inductive sensing sequentially.

In another embodiment, the device 200 may switch between capacitive sensing and inductive sensing based on an application the device 200 is being used for. For example, a device with the device 200 may have a low power mode that uses capacitive sensing for a power button. Once the device is turned on, the device may switch to using inductive sensing to receive user input.

In another embodiment, the device 200 may take capacitive sensing measurements until a signal to noise (SNR) level of the RX signal, which is an input charge (Vtank*Cc), exceeds a threshold SNR level. When the SNR level exceeds the threshold SNR level, the processor 119 in FIG. 2A may switch the PWM 228 and the CMC 210 to inductive sensing. When the device 200 is performing inductive sensing and the SNR level of the TX signal exceeds the threshold SNR level, the processor 119 may similarly switch the PWM 228 and the CMC 210 to capacitive sensing.

In one embodiment, the threshold SNR level may vary based on a size or type of object the device 200 it configured to sense. For example, when a size of the object is relatively small, the threshold SNR level may be increased to provide the device 200 sufficient time to perform capacitive or inductive sensing. More time may be needed because the TX signal may be noiser and it may take the CMC 210 longer to average several capacitive or inductive measurements to determine a presence of the object. Measuring for relatively smaller objects may take a longer amount of time than relatively large objects because the amount of coupling between the relatively small objects and the device 200 is smaller.

Figure 8:
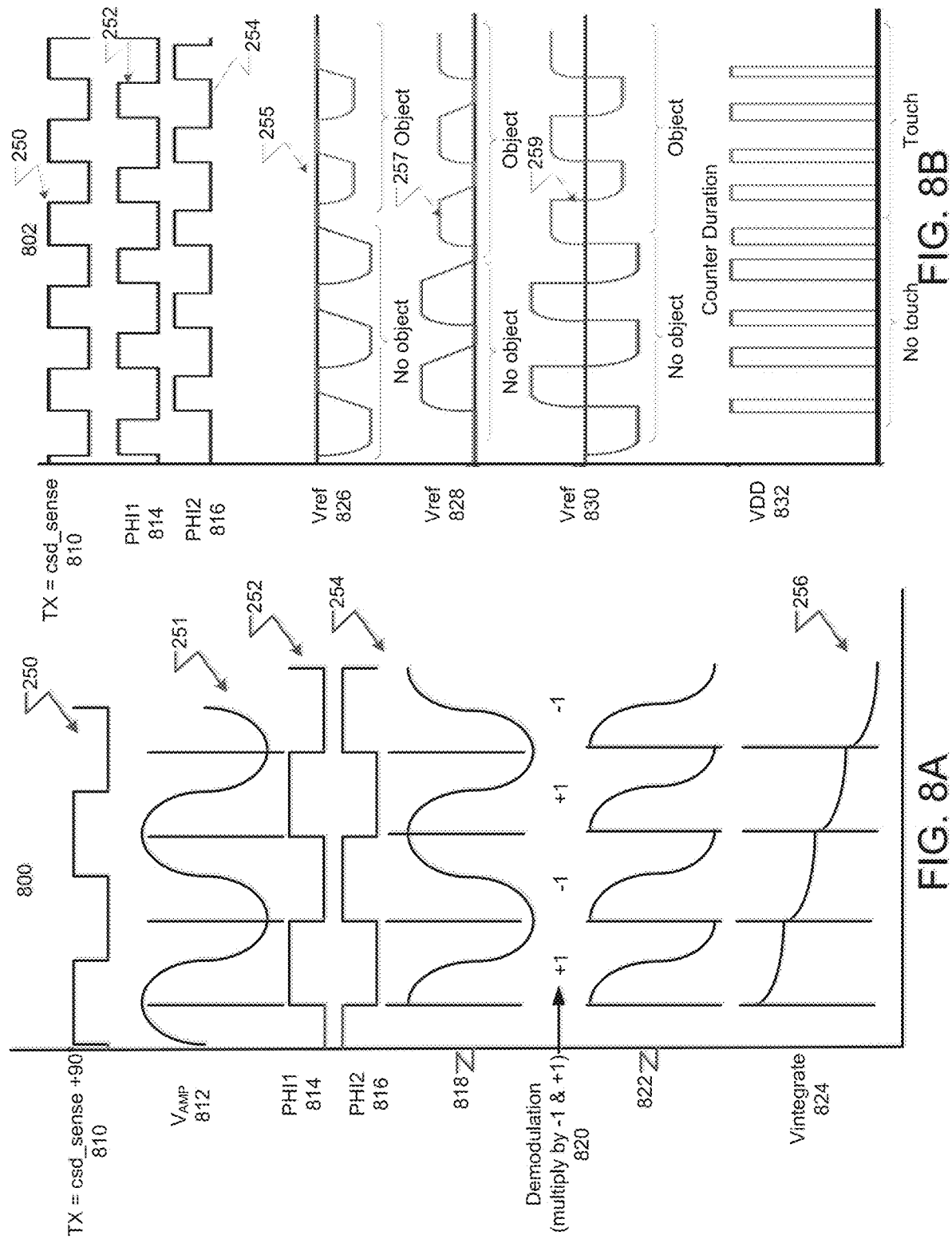
FIG. 8A illustrates a graph of a phase shifting and demodulation of a TX signal for inductive sensing, according to an embodiment.
FIG. 8B illustrates a graph with a TX signal for capacitive sensing, according to an embodiment.

FIG. 8A illustrates a graph 800 of a phase shifting and demodulation of a TX signal 810 for inductive sensing, according to an embodiment. As discussed above, the resonant circuit 224 in FIG. 2B may receive the TX signal 810 from the node 250 of the GPIO 226 which excites the components of the resonant circuit 224. For inductive sensing, the PWM 228 of the FIG. 2A phase shifts the TX signal.

In graph 800 for inductive sensing, the TX signal 810 may be phase shifted by approximately 90 degrees. The Vamp signal 812 may show a change in voltage at an inductor of the resonant circuit 224 and the capacitor 222. The Vamp signal 812 may be received at the GPIO 220. The Vamp signal 812 may be a sine wave as the inductor may not respond instantaneously to a change between a high voltage and a low voltage of the TX signal 810. In one example, the PWM 228 may phase shift the TX signal by 90 degrees with respect to the demodulation clocks signals PHI1 814 and PHI2 816. The demodulation clock signals PHI1 814 and PHI2 816 may be internal signals that feed from PHI1 252 and PHI2 254 of the digital sequencer 233 into the demodulator of the CMC 210 in FIG. 2A. In one embodiment, there may be a dead band between the PHI1 814 and PHI2 816. The dead band may be an interval of a signal domain or band where no action occurs. In another embodiment, the PHI1 814 and the PHI2 816 may control the switches of the CMC 210 in FIGS. 2A-6D.

The phase shifted TX signal may be phase shifted so that the peak of the sine wave Vamp signal 818 occurs 90° after a rising edge of the initial TX signal. The phase-shifted TX signal may be fully integrated by the CMC 210. The demodulator of the CMC 210 may switch the signals 820 received by the CMC 210 from the GPIOs 212, 216, and/or 220 to generate an aggregated signal 822 with the same phase. For example, the CMC 210 may add together the positive and negative portions of the signals from the GPIOs 212, 216, and 220 to obtain the signal 822. In this example, as the CMC 210 pushes and pulls charge from the resonant circuit 224, the CMC 210 may aggregate and integrate the signals together over time to generate a $V_{integrate}$ signal 824. The aggregation and integration of the signals may increase the amount of charge applied to the resonant circuit 224. The CMC 210 may also convert the signal 822 to a digital signal using an analog to digital converter (ADC).

The $V_{integrate}$ signal 824 may be a virtual voltage that illustrates an accumulation of a signal voltage. In one example, digital values from the converter may be accumulated using a counter, and the digital values may be sent from terminal 256 of the comparator 240. Each cycle is integrated and converted and the integration capacitors are returned to a value ($V_{ref}$) that the integration capacitors started at. The CMC 210 may use the digital values to apply a signal at the resonant circuit 224 to excite the components of the resonant circuit 224 for inductive sensing.

FIG. 8B illustrates a graph 802 with a TX signal 810 for capacitive sensing, according to an embodiment. The TX signal 810 may not be phase shifted with respect to the demodulation clocks signals PHI1 814 and PHI2 816. The demodulation clock signals PHI1 814 and PHI2 816 may be internal signals that feed from PHI1 252 and PHI2 254 of the digital sequencer 233 into the demodulator of the CMC 210 in FIG. 2A. The $V_{ref}$ 826 is the voltage seen from the signal of the capacitor 218 at point 255 in FIG. 2D. The $V_{ref}$ 828 is the voltage seen from the signal of the capacitor 214 at point 257 in FIG. 2D. The $V_{ref}$ 830 is the voltage seen from the signal of the GPIO 220 at point 259 in FIG. 2D. A count duration 832 is representative of the $V_{ref}$ 826, the $V_{ref}$ 828, and the $V_{ref}$ 830 may indicate whether an object is proximate to a sense unit.

In one example, digital values from the converter may be accumulated using a counter, and the digital values may be sent from terminal 256 of the comparator 240. Each cycle is integrated and converted into a digital value using the $V_{DD}$ at point 261 of FIG. 2D. The CMC 210 may use the digital values to determine whether an object is proximate the sense unit. For example, the CMC 210 may determine that an object is proximate the sense unit when a counter duration of the digital values changes.

Figure 9:
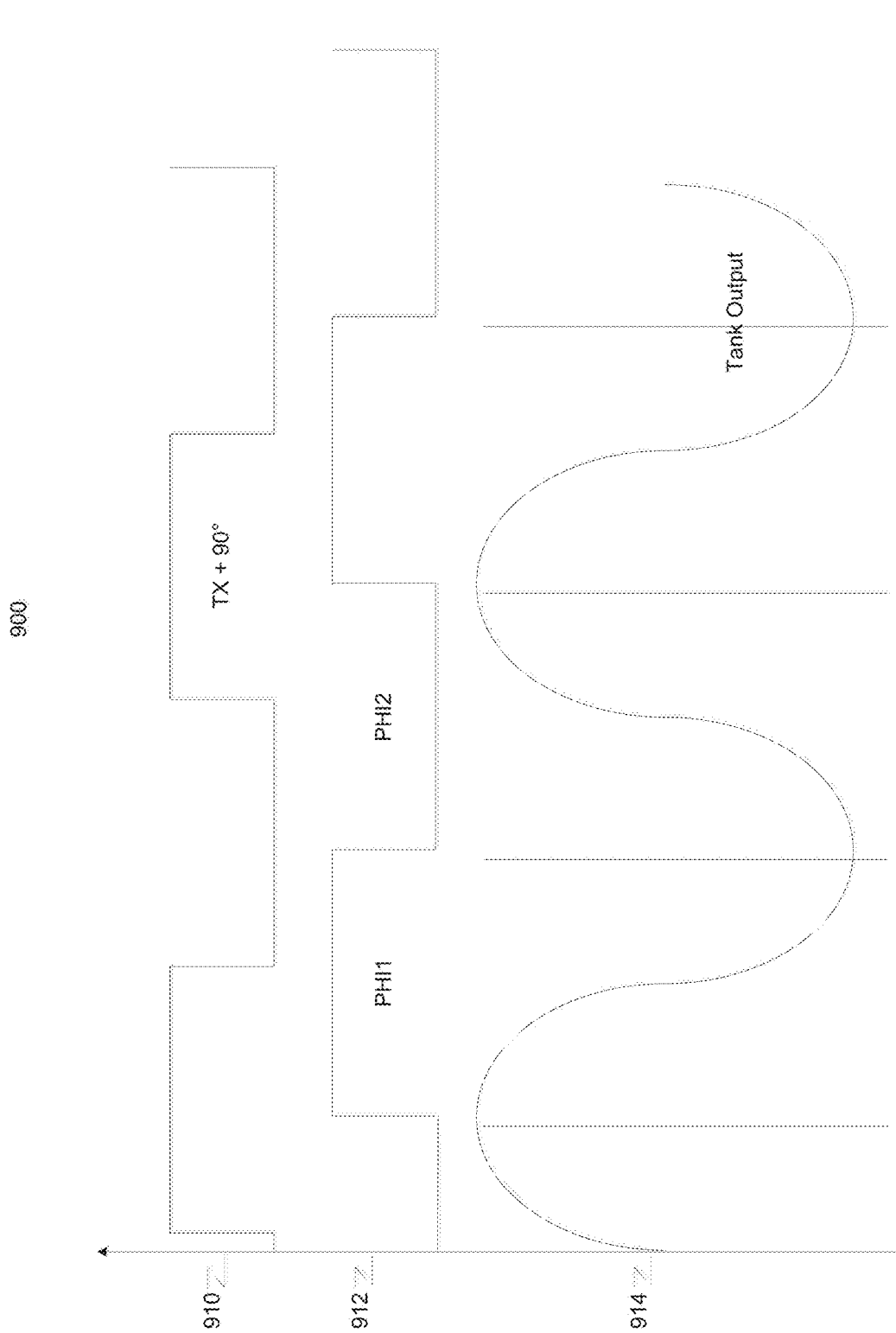
FIG. 9 illustrates a graph showing the phase shifting and demodulation of a resonant circuit output signal for inductive sensing, according to an embodiment.

FIG. 9 illustrates a graph 900 showing the phase shifting and demodulation of a resonant circuit output signal for inductive sensing, according to an embodiment. Some of the features in FIG. 9 are the same or similar to some of the features in FIG. 8 as noted by the same reference numbers, unless expressly described otherwise. The signal 912 shows that the PHI1 814 and the PHI2 816 may be combined into a demodulation clock signal 912 that feeds into the demodulator of the CMC 210 in FIG. 2A. The signal 912 may control the switches of the CMC 210 in FIGS. 2A-6D.

In one embodiment, during the PHI2 clock phase of the demodulation clock signal 912, a charge on an AMUX of the CMC 210 may rise above below a reference voltage ($V_{ref}$ HI). During the PHI1 clock phase the digital sequencer 233 in FIG. 2A may discharge the $C_{Tank}$ 218 back below the $V_{ref}$ HI. During the high phase of the demodulation clock signal 912, the voltage on the AMUX may increase above the $V_{ref}$ HI voltage. During the PHI2 clock phase, the digital sequencer 233 charges the $C_{Mod}$ 214 of FIG. 2A down to the reference voltage.

Figure 10A:
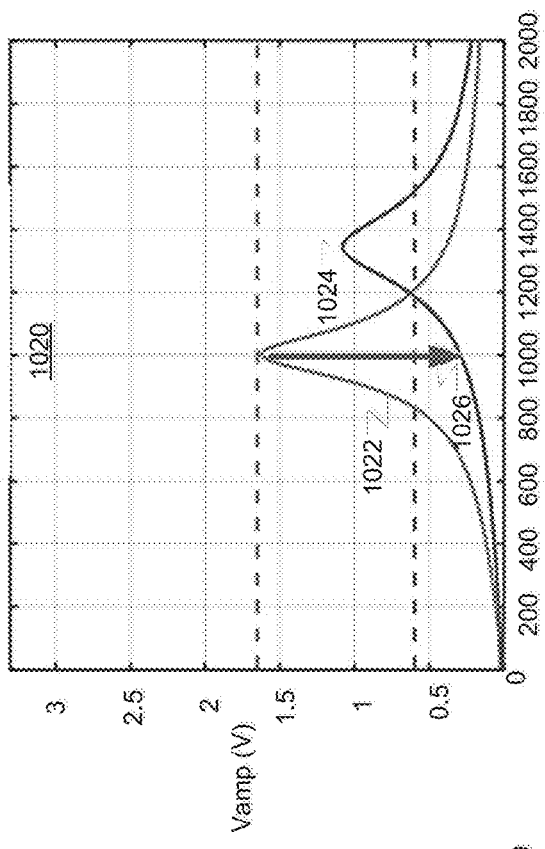
FIG. 10A shows a graph of the frequencies used by the CMC in FIG. 2A for inductive sensing, according to an embodiment.

FIG. 10A shows a graph 1000 of the frequencies used by the CMC 210 in FIG. 2A for inductive sensing, according to an embodiment. An electrode may be used for inductive sensing. The sensing range of an electrode may be dependent on the type of object being detected and the size and shape of the electrode. For example, ferrous metals, such as iron and steel, may allow for a longer sensing range, while nonferrous metals, such as aluminum and copper, can reduce a sensing range of the electrode by up to 60 percent.

In one embodiment, selecting a size and shape of an electrode may include determining an proximate to D_inner/D_outer ratio of the electrode, determining an inductance per turn (AL) for the electrode as the functions of the D_inner, D_Outer, thickness, trace and space width, number of turns and layers, and layout of the layers of the electrode. The size and shape of an electrode may vary based on the application it is used in. For example, the electrode shape may be a flat coil or a pancake spiral coil. When the electrode is used for capacitive sensing, a high potential may be applied to an outer terminal of the electrode rather than to the central or inner pad. A ratio of an inner diameter (D_inner) of the electrode to an outer diameter (D_outer) of the electrode may be based on the size of the object being detected and the operating distance between the electrode and object. In one example, the D_inner/D_outer ratio may be approximately 0.25 for objects relatively close to the electrode. In another example, the D_inner/D_outer ratio may be approximately 0.6 for objects relatively far from the electrode.

In another embodiment, selecting the size of the electrode may also include determining a coil capacitive coupling between the turns and layers of the electrode and between the ground and a target object. The inductance and resistance of the electrode may then be analyzed to select a size of the electrode with an optimal frequency response.

The optimal frequency of operation is where a signal difference between an object and no object is largest and where the digital values change by the largest amount. In one example, a resonant circuit may be excited by a TX signal at a resonant frequency of the resonant circuit. In one example, the resonant frequency of the resonant circuit may be $\frac{1}{2}*\pi*LC$. In another example, the farther the frequency moves away from the resonant frequency, the larger a difference in the signals may be. In another example, a series resistance in the resonant circuit 224 in FIG. 2A may be changed to amplify or attenuate the amount the difference in the signals.

The graph 1000 shows an amplitude of a reference signal 1012 and an amplitude of the RX signal 1010. At points 1014 and 1016, the difference in amplitude between the reference signal 1012 and the RX signal 1010 is the greatest indicating a greatest difference in the digital values. The differences in amplitudes indicate that approximately 600 kilohertz (kHz) or 1000 kHz is the optimal frequency.

Figure 10B:
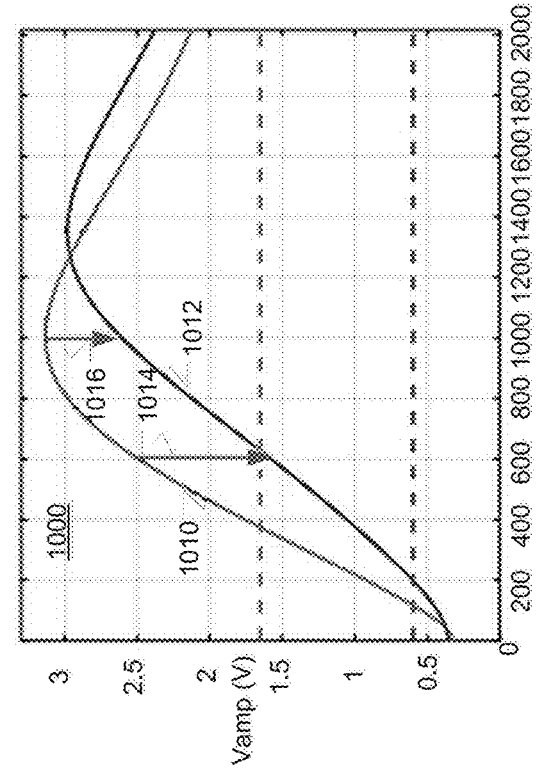
FIG. 10B shows a graph another frequency that may be used by the CMC in FIG. 2A for inductive sensing, according to an embodiment.

FIG. 10B shows a graph 1020 another frequency that may be used by the CMC 210 in FIG. 2A for inductive sensing, according to an embodiment. The graph 1020 shows an amplitude of a reference signal 1024 and an amplitude of the TX signal 1022. At point 1026, the difference in amplitude between the reference signal 1024 and the TX signal 1022 is the greatest. The differences in amplitudes indicate that approximately 1000 kHz is the optimal frequency.

Figure 10C:
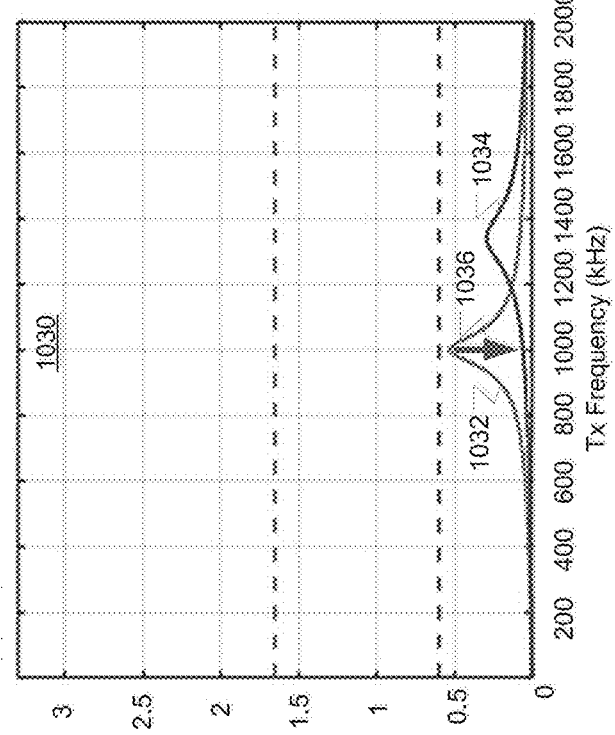
FIG. 10C shows a graph another frequency used by the CMC in FIG. 2A for inductive sensing, according to an embodiment.

FIG. 10C shows a graph 1030 another frequency used by the CMC 210 in FIG. 2A for inductive sensing, according to an embodiment. The graph 1030 shows an amplitude of a reference signal 1034 and an amplitude of the TX signal 1032. At point 1036, the difference in amplitude between the reference signal 1034 and the TX signal 1032 is the greatest. The differences in amplitudes indicate that approximately 1000 kHz is the optimal frequency.

Figure 11:
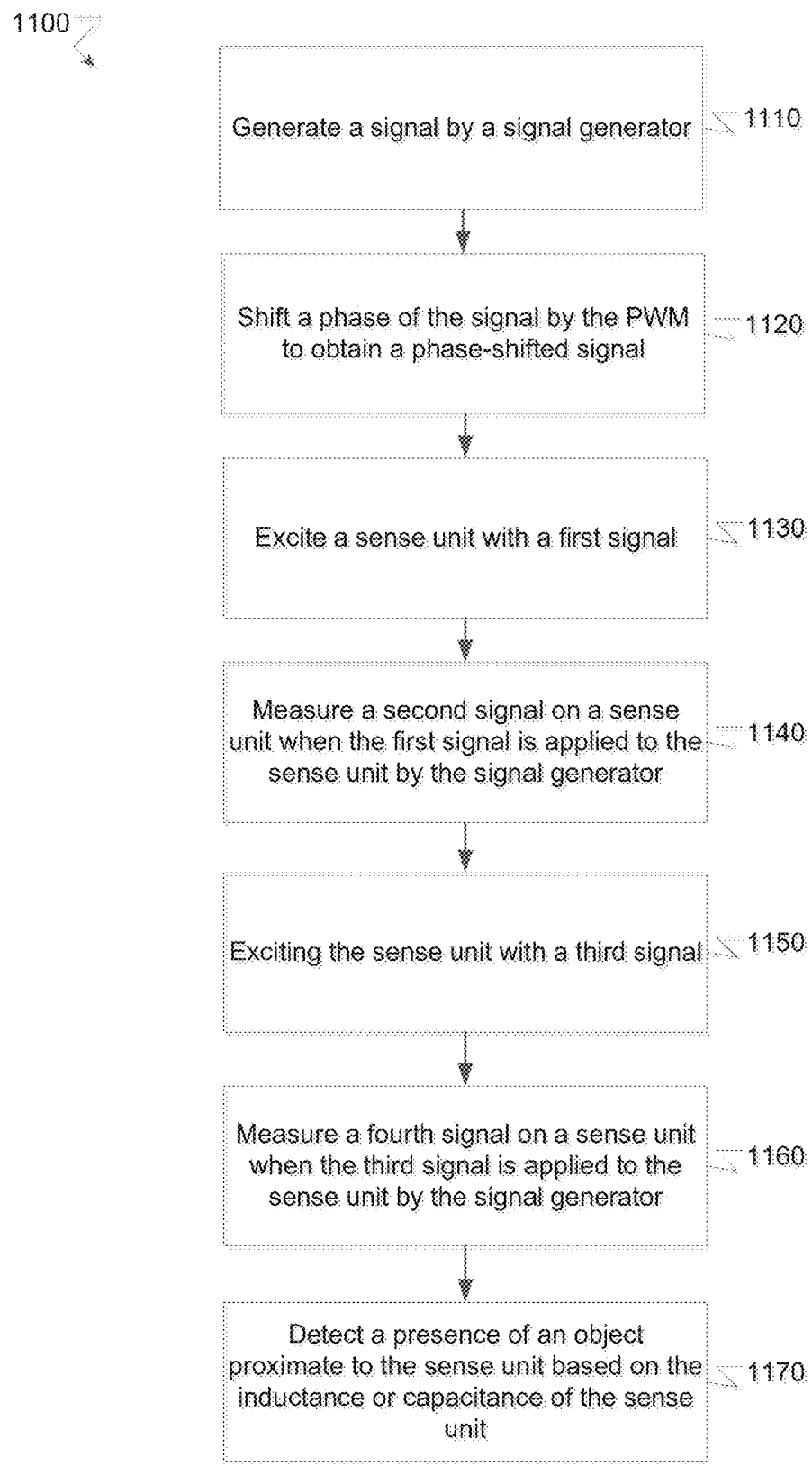
FIG. 11 illustrates a flow diagram of a method of determining an inductance of a sensing unit, according to another embodiment.

FIG. 11 illustrates a flow diagram of a method 1100 of determining an inductance or a capacitance of a sensing unit, according to one embodiment. The method 1100 may be performed by processing logic that comprises hardware (e.g., circuitry, dedicated logic, programmable logic, microcode, etc.), software (such as instructions run on a processing device), or a combination thereof. The method 1100 may be performed all or in part by device 200.

Method 1100 begins at block 1110 where a signal generator generates a first signal and a third signal. Method 1100 continues at block 1120 where the PWM may shift a phase of the first signal to obtain the third signal. In one example, the PWM may shift the phase of the third signal by approximately 90 degrees relative to a phase of a reference signal. Method 1100 continues at block 1130 where the first signal excites a sense unit. Method 1100 continues at block 1140 where a charge measuring circuit may measure a second signal on a sense unit when the first signal is applied to the sense unit by the signal generator. The second signal may be representative of a capacitance of the sense unit. Method 1100 continues at block 1150 the third signal may excite the sense unit. Method 1100 continues at block 1160 where the charge measuring circuit may measure a fourth signal on a sense unit when the third signal is applied to the sense unit by the signal generator. The fourth signal may be representative of an inductance of the sense unit.

Figure 12:
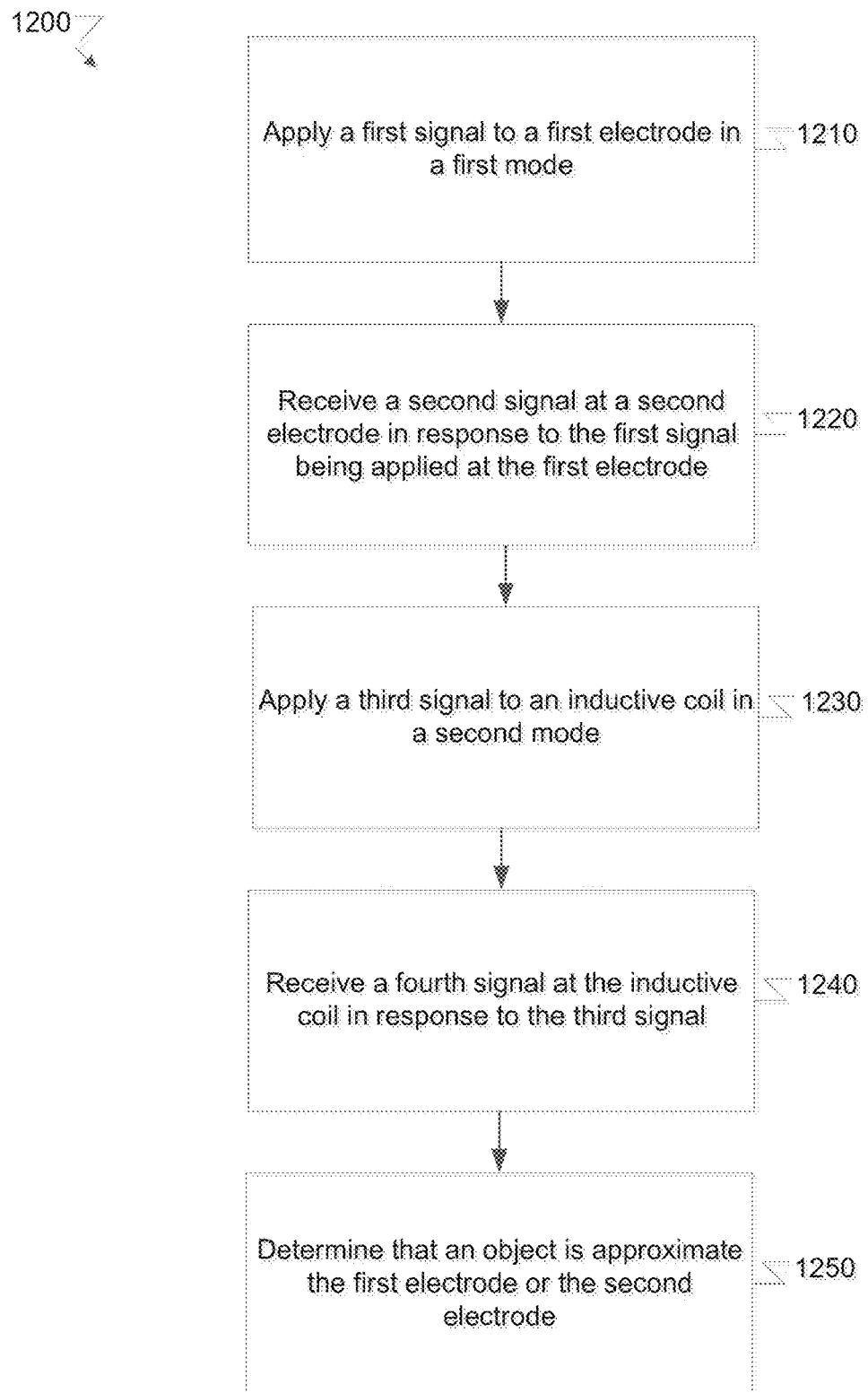
FIG. 12 illustrates a flow diagram of a method of applying signals to a first electrode and a second electrode, according to another embodiment.

FIG. 12 illustrates a flow diagram of a method 1200 of applying signals to a first electrode and a second electrode, according to another embodiment. The method 1200 may be performed by processing logic that comprises hardware (e.g., circuitry, dedicated logic, programmable logic, microcode, etc.), software (such as instructions run on a processing device), or a combination thereof. The method 1200 may be performed all or in part by device 200.

Method 1200 begins at block 1210 where a first signal may be applied to a first electrode in a first mode. Method 1200 continues at block 1220 where a second signal is received at a second electrode in response to the first signal being applied at the first electrode. The second signal may be indicative of a capacitance between the first electrode and the second electrode. Method 1200 continues at block 1230 where a third signal is applied to an inductive coil in a second mode. Method 1200 continues at block 1240 where a fourth signal is received at the inductive coil in response to the third signal. The fourth signal is indicative of an inductance of the inductive coil. The fourth signal may be indicative of an inductance of the second electrode. Method 1200 continues at block 1240 where a CMC may determine that an object is proximate to the first electrode, the second electrode, or the inductive coil. In one example, the CMC may determine that a capacitive object is proximate to the first electrode or the second electrode when the second signal changes. The change in the second signal is indicative of a change in the capacitance between the first electrode and the second electrode. In another example, the CMC may determine that a ferrous metal object or a non-ferrous metal object is proximate to the inductive coil when the fourth signal changes. The change in the fourth signal may indicative of a change in inductance at the inductive coil.

Embodiments of the present invention include various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present embodiments. Thus, the specific details set forth are merely exemplary. Particular embodiments may vary from these exemplary details and still be contemplated to be within the scope of the present invention.

What is claimed is:
1. An apparatus comprising:
 a first terminal for receiving a first signal from a signal generator in a first mode and a second signal from the signal generator in a second mode; and
 a second terminal:

for receiving a third signal in the first mode, the third signal received on the second terminal concurrent with the first signal received on the first terminal, wherein the third signal is responsive to changes in an inductance of a sensor cell between the first and second terminals in the first mode;

for receiving a fourth signal in the second mode, the fourth signal received on the second terminal concurrent with the second signal received on the first terminal, wherein the fourth signal is responsive to changes in a capacitance of a sensor cell between he first and second terminals in the second mode.

2. The apparatus of claim 1 further comprising a measurement circuit coupled to the second terminal, the measurement circuit for receiving the third signal in the first mode and the fourth signal in the second mode.

3. The apparatus of claim 2, wherein the measurement circuit comprises a capacitive sensing sigma-delta (CSD) unit configured to measure the inductance of the sensor cell in the first mode and the capacitance of the sensor cell in the second mode, and wherein signal generator is to generate the first signal, the second signal, or both the first and the second signal and a phase shifter is to shift a phase of the generated signal.

4. The apparatus of claim 2, wherein the measurement circuit is configured to:
operate at a first frequency for the first mode; and
operate at a second frequency for the second mode.

5. The apparatus of claim 4, wherein the first frequency is a resonant frequency of the charge measurement circuit and the second frequency is at a frequency other than the resonant frequency.

6. The apparatus of claim 2, wherein the measurement circuit is configured to detect an object proximate to the sensor cell using at least one of the first signal or the second signal.

7. The apparatus of claim 2, wherein the measurement circuit is further configured to:
measure a charge of the first signal to determine the inductance of the sensor cell; and
measure a charge of the second signal to determine the capacitance of the sensor cell.

8. The apparatus of claim 1, wherein the sensor cell comprises a first electrode coupled to the first terminal and a second electrode coupled to the second terminal, wherein the capacitance is a mutual capacitance between the first electrode and the second electrode.

9. A device comprising:
a signal generator to generate a first signal, the signal generator to selectively output the first signal on a first terminal;
a phase shifter coupled to the signal generator, the phase shifter to shift a phase of the first signal by approximately 90 degrees to obtain a second signal, the phase shifter to selectively output on the first terminal; and
a charge measuring circuit to:
measure on a second terminal a third signal on a sensor cell when the second signal is applied to the first terminal of the sensor cell by the signal generator, wherein the third signal is representative of a measured capacitance of the sensor cell;
measure on the second terminal a fourth signal on the sensor cell when the second signal is applied to the first terminal of the sensor cell by the signal generator, wherein the fourth signal is representative of an inductance of the sensor cell coupled between the phase shifter and the charge measuring circuit, and measure on a third terminal a fifth signal representative of a modulation capacitance, wherein the third terminal is decoupled from the second terminal.

10. The device of claim 9, wherein the charge measuring circuit is further to detect a presence of an object proximate to the sensor cell in a first mode when a first digital value representative of the third signal exceeds a second digital value representative of the fifth signal.

11. The device of claim 10, further comprising a digital sequencer coupled to the charge measuring circuit, the digital sequencer is configured to control one or more switches at the charge measuring circuit to switch the charge measuring circuit between the first mode and a second mode.

12. The device of claim 9, wherein the signal generator and the phase shifter are part of a pulse width modulator (PWM).

13. The device of claim 9, wherein the capacitance of the sensor cell indicates a proximity of a conductive object proximate to the sensor cell and wherein the inductance of the sensor cell indicates a proximity of a ferrous metal object or a non-ferrous metal object proximate to the sensor cell.

14. The device of claim 9, wherein to determine the inductance of the sensor cell, the charge measuring circuit is to compare a first digital value representative of the fourth signal with a second digital value representative of the fifth signal.

15. The device of claim 14, wherein when a difference between the first digital value and the second digital value exceeds a threshold value, the difference indicates a ferrous metal object or a non-ferrous metal object is proximate to the sensor cell.

16. The device of claim 9, wherein the charge measuring circuit is further configured to:
determine the capacitance of the sensor cell using the second signal, when the first signal is applied to the sensor cell by the signal generator; and
determine the inductance of the sensor cell using the fourth signal, when the second signal is applied to the sensor cell by the signal generator.

17. The device of claim 9, wherein the phase shifter shifts the phase of the second signal so that a peak of the second signal occurs approximately 90 degrees after a rising edge of a reference signal at the charge measuring circuit.

18. A method comprising:
exciting a first electrode of a sensor cell with a first signal by a signal generator on a first terminal coupled to the first electrode;
measuring, by a charge measuring circuit on a second terminal coupled to a second electrode, a second signal on the sensor cell when the first signal is applied to the first terminal, wherein the second signal is representative of an inductance of the sensor;
exciting the first electrode of the sensor cell with a third signal by the signal generator on the first terminal;
measuring, by the charge measuring circuit on the second terminal, a fourth signal on the sensor cell when the third signal is applied to the first terminal of the sensor cell by the signal generator, wherein the fourth signal is representative of a capacitance including a mutual capacitance formed between the first and second electrodes; and
measuring, by the charge measuring circuit on a third terminal, a fifth signal representative of a modulation capacitance, wherein the third terminal is decoupled from the second terminal.

19. The method of claim 18, further comprising detecting a presence of an object proximate to the sensor cell based on the inductance or capacitance of the sensor cell.

20. The method of claim 18, wherein the method further comprises:
- generating the first signal and the third signal by the signal generator; and
- shifting a phase of the first signal to obtain the third signal by a pulse width modulator (PWM).

* * * * *